(12) United States Patent
Inoue et al.

(10) Patent No.: US 10,290,253 B2
(45) Date of Patent: May 14, 2019

(54) SEMICONDUCTOR DEVICE, SYSTEM, AND METHOD FOR OPERATING SYSTEM

(71) Applicant: Semiconductor Energy Laboratory Co., Ltd., Atsugi-shi, Kanagawa-ken (JP)

(72) Inventors: Tatsunori Inoue, Kanagawa (JP); Takeshi Aoki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 143 days.

(21) Appl. No.: 15/615,997

(22) Filed: Jun. 7, 2017

(65) Prior Publication Data
US 2017/0358254 A1    Dec. 14, 2017

(30) Foreign Application Priority Data
Jun. 10, 2016   (JP) .................................. 2016-116104

(51) Int. Cl.
*G09G 3/20*           (2006.01)
*G09G 3/3225*       (2016.01)
(Continued)

(52) U.S. Cl.
CPC ......... *G09G 3/2007* (2013.01); *G09G 3/3225* (2013.01); *G09G 3/3648* (2013.01);
(Continued)

(58) Field of Classification Search
CPC .. G09G 3/2007; G09G 3/3225; G09G 3/3648; G09G 3/3406
See application file for complete search history.

(56) References Cited

U.S. PATENT DOCUMENTS 6,714,268 B2    3/2004   Wang et al.
7,038,641 B2    5/2006   Hirota et al.
(Continued)

FOREIGN PATENT DOCUMENTS

JP      2001-066593 A    3/2001
JP      2002-196702 A    7/2002
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Michael A Faragalla
*Assistant Examiner* — Chayce R Bibbee
(74) *Attorney, Agent, or Firm* — Fish & Richardson P.C.

(57) ABSTRACT

An object is to provide a semiconductor device that automatically adjusts the luminance of a display device. The semiconductor device includes an illuminometer, a threshold detector, a timing controller, a digital-to-analog converter circuit, a first display panel, and a second display panel. The illuminance of external light is measured with the illuminometer, and the threshold value of digital video data is determined by the threshold detector in accordance with the illuminance. The timing controller generates a signal for the first display panel or a signal for the second display panel on the basis of the threshold value and video data transmitted from the outside. The signal for the first display panel and the signal for the second display panel are input to one digital-to-analog converter circuit and converted into digital signals, and the obtained digital signals are input to a corresponding one of the first display panel and the second display panel.

13 Claims, 20 Drawing Sheets

(51) Int. Cl.
*G09G 3/36* (2006.01)
*H01L 27/12* (2006.01)
*H03K 19/08* (2006.01)

(52) U.S. Cl.
CPC ... *H01L 27/1225* (2013.01); *G09G 2300/046* (2013.01); *G09G 2300/0426* (2013.01); *G09G 2300/0814* (2013.01); *G09G 2300/0833* (2013.01); *G09G 2310/027* (2013.01); *G09G 2360/144* (2013.01); *H03K 19/08* (2013.01)

(56) References Cited

U.S. PATENT DOCUMENTS

| | | | |
|---|---|---|---|
| 7,084,936 | B2 | 8/2006 | Kato |
| 7,102,704 | B2 | 9/2006 | Mitsui et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,385,654 | B2 | 6/2008 | Mitsui et al. |
| 8,094,107 | B2 | 1/2012 | Nishimura et al. |
| 8,149,190 | B2 | 4/2012 | Mizukoshi et al. |
| 2002/0011978 | A1 | 1/2002 | Yamazaki et al. |
| 2003/0107688 | A1 | 6/2003 | Yamagishi |
| 2003/0193457 | A1 | 10/2003 | Wang et al. |
| 2003/0201960 | A1 | 10/2003 | Fujieda |
| 2006/0072047 | A1 | 4/2006 | Sekiguchi |
| 2007/0075935 | A1 | 4/2007 | Mesmer et al. |
| 2008/0074592 | A1 | 3/2008 | Araki et al. |
| 2008/0180618 | A1 | 7/2008 | Fujieda |
| 2009/0146913 | A1 | 6/2009 | Tanabe |
| 2009/0231241 | A1 | 9/2009 | Abe |
| 2010/0171905 | A1 | 7/2010 | Huang et al. |
| 2010/0207967 | A1 | 8/2010 | Baek et al. |
| 2016/0299387 | A1 | 10/2016 | Yamazaki et al. |
| 2017/0092177 | A1 | 3/2017 | Kobayashi et al. |
| 2017/0103714 | A1 | 4/2017 | Yamamoto et al. |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 2008-225381 A | 9/2008 |
| JP | 4161574 B2 | 10/2008 |
| JP | 2013-221965 A | 10/2013 |
| WO | WO-2004-053819 A | 6/2004 |
| WO | WO-2007/041150 | 4/2007 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

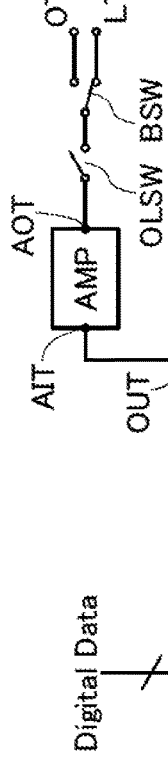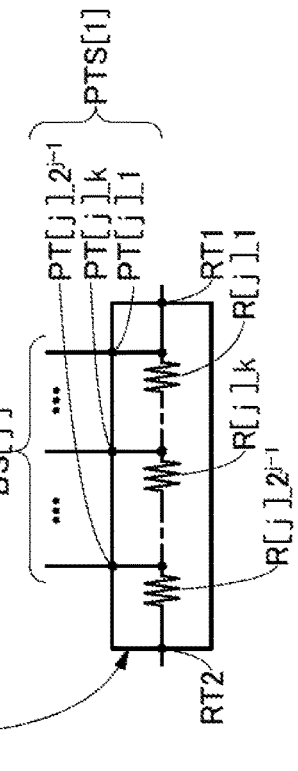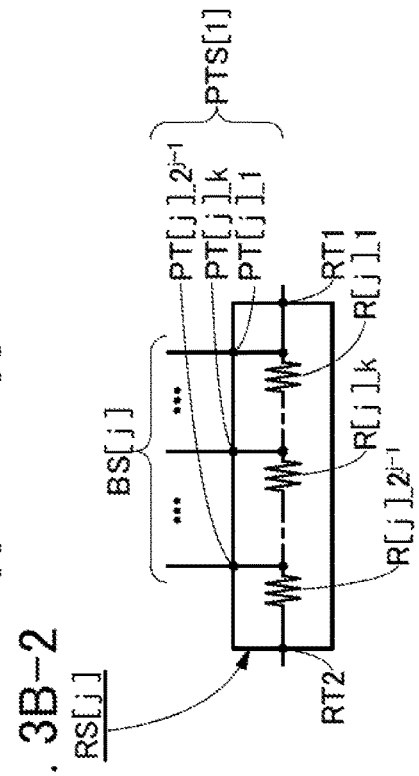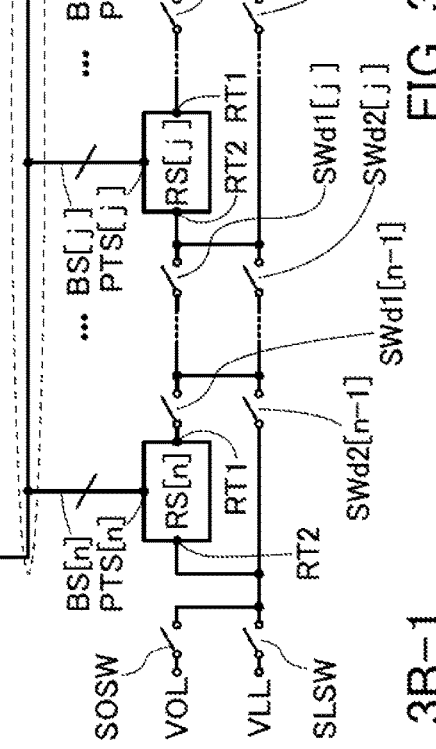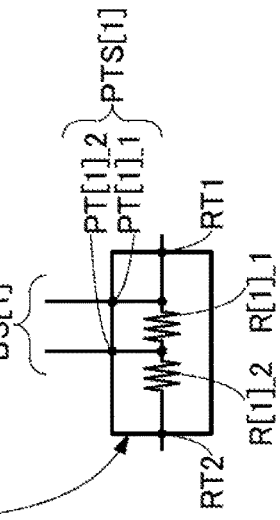

SEMICONDUCTOR DEVICE, SYSTEM, AND METHOD FOR OPERATING SYSTEM

BACKGROUND OF THE INVENTION

1. Field of the Invention

One embodiment of the present invention relates to a semiconductor device, a system, and a method for operating the system.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

Display devices included in mobile phones such as smartphones, tablet information terminals, and notebook personal computers (PC) have undergone various improvements in recent years. For example, there have been developed display devices with features such as higher resolution, higher color reproducibility (higher NTSC ratio), a smaller driver circuit, and lower power consumption.

As an example, an improved display device has a function of automatically adjusting the brightness of an image displayed on the display device in accordance with ambient light. An example of such a display device is a display device having a function of displaying an image by reflecting ambient light and a function of displaying an image by making a light-emitting element emit light. This structure enables the brightness of an image displayed on a display device to be adjusted in the following manner: the display device enters into a display mode for displaying an image with the use of reflected light (hereinafter referred to as reflective mode) when ambient light is sufficiently strong, whereas the display device enters into a display mode for displaying an image with light emitted from a light-emitting element (hereinafter referred to as transmissive mode or self-luminous mode) when ambient light is weak. In other words, the display device can display images in a display mode that is selected from the reflective mode, the self-luminous mode, and a mode using both the reflective and self-luminous modes in accordance with the intensity of ambient light sensed with an illuminometer (illuminance sensor).

As examples of a display device having a function of displaying an image by making a light-emitting element emit light and a function of displaying an image by reflecting ambient light, Patent Documents 1 to 3 each disclose a display device in which one pixel includes a pixel circuit for controlling a liquid crystal element and a pixel circuit for controlling a light-emitting element (such a display device is referred to as a hybrid display device).

Patent Document

Patent Document 1: United States Patent Application Publication No. 2003/0107688

Patent Document 2: PCT International Publication No. WO2007/041150

Patent Document 3: Japanese Published Patent Application No. 2008-225381

SUMMARY OF THE INVENTION

To have a function of displaying an image with light emitted from a light-emitting element and a function of displaying an image with reflection of ambient light, a display device needs to include a display panel having the former function and a display panel having the latter function. In this case, to drive these display panels, a driver circuit needs to be provided for each of the display panels; thus, the area of the driver circuits over the display panels is sometimes large. Moreover, an increased number of driver circuits may result in higher power consumption of the display device.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a system using the module including the novel semiconductor device.

Another object of one embodiment of the present invention is to provide a semiconductor device with a small circuit area. Another object of one embodiment of the present invention is to provide a semiconductor device with low power consumption.

Note that the objects of one embodiment of the present invention are not limited to the above. The objects described above do not preclude the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. Note that one embodiment of the present invention need not solve all the aforementioned objects and the other objects.

(1) One embodiment of the present invention is a semiconductor device including a pass transistor logic circuit, a first circuit, a second circuit, a first switch, a second switch, and a selector. The first circuit has a first terminal, a second terminal, and a first output terminal. The second circuit has a third terminal, a fourth terminal, and a second output terminal. The pass transistor logic circuit has first to third input terminals and a third output terminal. The selector has a fourth input terminal, a fourth output terminal, and a fifth output terminal. The third terminal of the second circuit is electrically connected to one terminal of the first switch. The second terminal of the first circuit is electrically connected to the other terminal of the first switch. One terminal of the second switch is electrically connected to the fourth terminal of the second circuit. The other terminal of the second switch is electrically connected to the second terminal of the first circuit. The first output terminal of the first circuit is electrically connected to the first input terminal of the pass transistor logic circuit. The second output terminal of the second circuit is electrically connected to the second input terminal of the pass transistor logic circuit. The third output terminal of the pass transistor logic circuit is electrically connected to the fourth input terminal of the selector. The first circuit and the second circuit each include a resistor string. When digital data is input to the third input terminal of the pass transistor logic circuit, the semiconductor device has a function of converting the digital data into analog data, and a function of outputting the analog data from the fourth output terminal or the fifth output terminal of the selector.

(2) In one embodiment of the present invention, the semiconductor device according to the embodiment (1) includes a third circuit between an electrical connection between the third output terminal of the pass transistor logic circuit and the fourth input terminal of the selector. The third circuit has a fifth input terminal and a sixth output terminal. The fifth input terminal of the third circuit is electrically connected to the third output terminal of the pass transistor logic circuit. The sixth output terminal of the third circuit is electrically connected to the fourth input terminal of the selector. The third circuit has a function of amplifying a potential input to the fifth input terminal of the third circuit and outputting the amplified potential to the sixth output terminal of the third circuit.

(3) In one embodiment of the present invention, the semiconductor device according to the embodiment (2) is configured such that the third circuit has a fifth terminal, and the third circuit is configured to stop operating in accordance with a potential input to the fifth terminal of the third circuit.

(4) In one embodiment of the present invention, the semiconductor device according to the embodiment (1) includes a third switch between an electrical connection between the third output terminal of the pass transistor logic circuit and the fourth input terminal of the selector. One terminal of the third switch is electrically connected to the third output terminal of the pass transistor logic circuit. The other terminal of the third switch is electrically connected to the fourth input terminal of the selector.

(5) In one embodiment of the present invention, the semiconductor device according to the embodiment (4) is configured such that the third switch includes a first transistor, and a channel formation region of the first transistor contains an oxide containing at least one of indium, an element M (aluminum, gallium, yttrium, or tin), and zinc.

(6) In one embodiment of the present invention, the semiconductor device according to the embodiment (1) includes a third switch and a third circuit between an electrical connection between the third output terminal of the pass transistor logic circuit and the fourth input terminal of the selector. The third circuit has a fifth input terminal and a sixth output terminal. The fifth input terminal of the third circuit is electrically connected to the third output terminal of the pass transistor logic circuit. The sixth output terminal of the third circuit is electrically connected to one terminal of the third switch. The other terminal of the third switch is electrically connected to the fourth input terminal of the selector. The third circuit has a function of amplifying a potential input to the fifth input terminal of the third circuit and outputting the amplified potential to the sixth output terminal of the third circuit.

(7) In one embodiment of the present invention, the semiconductor device according to the embodiment (6) is configured such that the third switch includes a first transistor, and a channel formation region of the first transistor contains an oxide containing at least one of indium, an element M (aluminum, gallium, yttrium, or tin), and zinc.

(8) In one embodiment of the present invention, the semiconductor device according to any one of the embodiments (2), (3), (6), and (7) is configured as follows. The third circuit includes an operational amplifier. The fifth input terminal of the third circuit is electrically connected to a non-inverting input terminal of the operational amplifier. The sixth output terminal of the third circuit is electrically connected to an output terminal of the operational amplifier. The output terminal of the operational amplifier is electrically connected to an inverting input terminal of the operational amplifier.

(9) In one embodiment of the present invention, the semiconductor device according to any one of the embodiments (1) to (8) is configured as follows. The first circuit has a first resistor and a second resistor. The second circuit has a third resistor and a fourth resistor. The first output terminal of the first circuit includes a fifth terminal and a sixth terminal. The second output terminal of the second circuit includes a seventh terminal and an eighth terminal. The first terminal of the first circuit is electrically connected to one terminal of the first resistor. The other terminal of the first resistor is electrically connected to one terminal of the second resistor. The other terminal of the second resistor is electrically connected to the second terminal of the first circuit. The fifth terminal is electrically connected to the one terminal of the first resistor. The sixth terminal is electrically connected to the one terminal of the second resistor. The third terminal of the second circuit is electrically connected to one terminal of the third resistor. The other terminal of the third resistor is electrically connected to one terminal of the fourth resistor. The other terminal of the fourth resistor is electrically connected to the fourth terminal of the second circuit. The seventh terminal is electrically connected to the one terminal of the third resistor. The eighth terminal is electrically connected to the one terminal of the fourth resistor.

(10) In one embodiment of the present invention, the semiconductor device according to any one of the embodiments (1) to (9) is configured such that the first switch and the second switch each include a second transistor, and a channel formation region of the second transistor contains an oxide containing at least one of indium, an element M (aluminum, gallium, yttrium, or tin), and zinc.

(11) In one embodiment of the present invention, the semiconductor device according to any one of the embodiments (1) to (10) includes a fourth switch and a fifth switch. One terminal of the fourth switch is electrically connected to the fourth terminal. One terminal of the fifth switch is electrically connected to the fourth terminal.

(12) One embodiment of the present invention is a system including the semiconductor device according to any one of the embodiments (1) to (11), an illuminometer, a fourth circuit, a fifth circuit, a first display panel, and a second display panel. The illuminometer is electrically connected to the fourth circuit. The fourth circuit is electrically connected to the fifth circuit. The fifth circuit is electrically connected to the semiconductor device. The first display panel is electrically connected to the semiconductor device. The second display panel is electrically connected to the semiconductor device. The fourth circuit has a function of generating first data for determining grayscale of an image displayed on the first display panel and/or the second display panel, in accordance with illuminance measured with the illuminometer. The fifth circuit has a function of generating an input signal transmitted to the semiconductor device, in accordance with second data transmitted from the outside and information on the grayscale.

(13) One embodiment of the present invention is a method for operating the system according to the embodiment (12), including first to tenth steps. The first step includes a step of measuring the illuminance by the illuminometer. The second step includes a step of transmitting the illuminance from the illuminometer to the fourth circuit. The third step includes a step of generating the first data for determining the grayscale of the image displayed on the first display panel and the grayscale of the image displayed on the second display panel by the fourth circuit in accordance with the illuminance. The fourth step includes a step of transmitting the first data from the fourth circuit to the fifth circuit, and a step of transmitting the second data from the outside to the fifth circuit. The fifth step includes a step of initializing the semiconductor device. The sixth step includes a step in which third data to be transmitted to the first display panel is generated by the fifth circuit in accordance with the first data and the second data, a step of transmitting the third data from the fifth circuit to the semiconductor device, and a step of performing digital-to-analog conversion on the third data to obtain fourth data by the semiconductor device. The seventh step includes a step of transmitting the fourth data from the semiconductor device to the first display panel and displaying the image on the first display panel. The eighth step includes a step of initializing the semiconductor device. The ninth step includes a step in which fifth data to be transmitted to the second display panel is generated by the fifth circuit in accordance with the first data and the second data, a step of transmitting the fifth data from the fifth circuit to the semiconductor device, and a step of performing digital-to-analog conversion on the fifth data to obtain sixth data by the semiconductor device. The tenth step includes a step of transmitting the sixth data from the semiconductor device to the second display panel and displaying the image on the second display panel. The second data is video data.

One embodiment of the present invention can provide a novel semiconductor device. Another embodiment of the present invention can provide a module including the novel semiconductor device. Another embodiment of the present invention can provide an electronic device using the module including the novel semiconductor device. Another embodiment of the present invention can provide a system using the module including the novel semiconductor device.

Another embodiment of the present invention can provide a semiconductor device with a small circuit area. Another embodiment of the present invention can provide a semiconductor device with low power consumption.

Note that the effects of one embodiment of the present invention are not limited to the above. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

In the accompanying drawings:

FIGS. 2A, 2B-1 to 2B-3, and 2C-1 to 2C-3 show the operating principle of a semiconductor device;

FIGS. 3A, 3B-1, and 3B-2 are circuit diagrams illustrating an example of a semiconductor device;

FIGS. 13A, 13B-1, 13B-2, and 13C illustrate a structure example of a touch panel;

DETAILED DESCRIPTION OF THE INVENTION

An "electronic device," an "electronic component," a "module," and a "semiconductor device" are described. In general, an electronic device may refer to a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An electronic component or a module may refer to a processor, a memory device, a sensor, a battery, a display device, a light-emitting device, an interface device, a radio frequency (RF) tag, a receiver, or a transmitter included in an electronic device. A semiconductor device may refer to a device including a semiconductor element or a driver circuit, a control circuit, a logic circuit, a signal generator circuit, a signal converter circuit, a potential level converter circuit, a voltage source, a current source, a switching circuit, an amplifier circuit, a memory circuit, a memory cell, a display circuit, a display pixel, or the like that includes a semiconductor element and is included in an electronic component or a module.

In this specification, an oxide semiconductor is referred to as "OS" in some cases. Thus, a transistor containing an oxide semiconductor in a channel formation region is sometimes referred to as an OS transistor.

Embodiment 1

In this embodiment, an example of a semiconductor device that can be provided in a display device will be described.

<Structure Example of Semiconductor Device>

Figure 1:
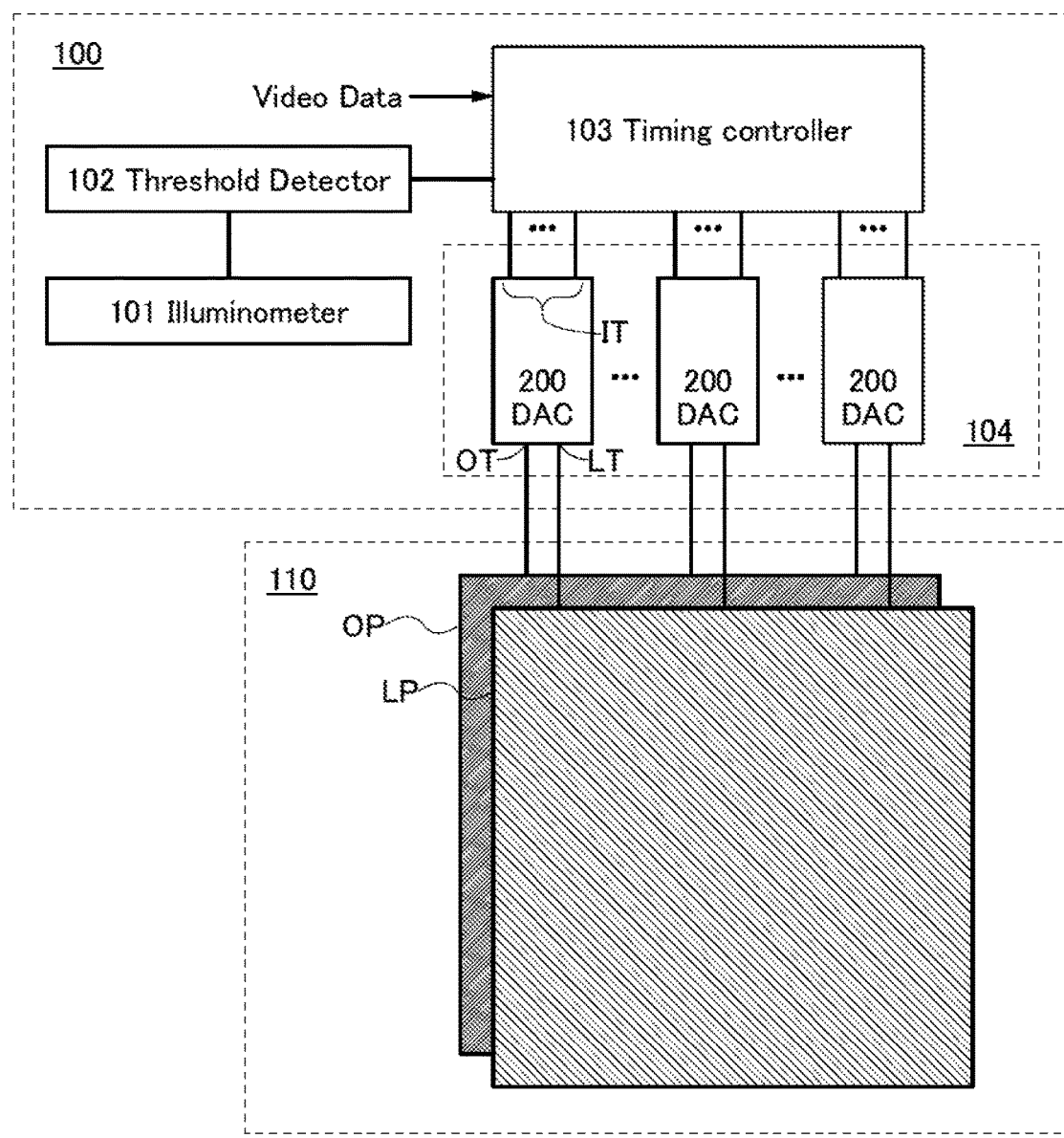
FIG. 1 is a block diagram illustrating an example of a semiconductor device and an example of a display portion.

FIG. 1 illustrates an example of a display portion and a driver circuit portion that can be provided in a display device. A semiconductor device 100 illustrated in FIG. 1 is part of a source driver capable of driving a pixel circuit including a liquid crystal element and a pixel circuit including a light-emitting element. The semiconductor device 100 includes an illuminometer 101, a threshold-value detection circuit (hereinafter referred to as threshold detector) 102, a timing controller 103, and a circuit 104. The semiconductor device 100 is electrically connected to a display portion 110.

The display portion 110 includes a display panel LP and a display panel OP. The display panel LP can be, for example, a reflective liquid crystal panel including a liquid crystal element. The display panel OP can be a light-emitting device including a light-emitting element, such as an organic EL panel including an organic light-emitting diode (OLED) as a light-emitting element. In the description of this embodiment, the display panel LP is a reflective liquid crystal panel, and the display panel OP is an organic EL panel.

The illuminometer 101 is electrically connected to the threshold detector 102. The threshold detector 102 is electrically connected to the timing controller 103. The timing controller 103 is electrically connected to the circuit 104. The circuit 104 is electrically connected to the display panel LP and the display panel OP.

The illuminometer 101 includes a device capable of measuring the illuminance of external light. The illuminometer 101 can include a photodetector using a photodiode, for example.

The threshold detector 102 has a function of obtaining the illuminance measured with the illuminometer 101, determining grayscale for the display device in accordance with the illuminance, and transmitting grayscale information to the timing controller 103.

The timing controller 103 is a circuit for assigning, to source lines, digital video sources (referred to as video data or digital video data) that are transmitted in serial from the outside, and generating a signal input to digital-to-analog converter circuits 200 connected to the respective source lines on the basis of the assigned digital video data, the grayscale information transmitted from the threshold detector 102, and a display mode of the display portion 110. The display mode refers to a method for driving the display portion 110 and is any of a reflective mode (in which an image is displayed on the display panel LP), a transmissive mode (in which an image is displayed on the display panel OP), an inactive mode (in which the operation of the digital-to-analog converter circuits 200 stops), and the like. The display mode may also include a mode for displaying images on both the display panel LP and the display panel OP (reflective+transmissive mode). The digital-to-analog converter circuit 200 will be described later in detail.

Note that there may be a plurality of signals that are input to the digital-to-analog converter circuit 200 and generated by the timing controller 103. For this reason, FIG. 1 shows a plurality of wirings that electrically connects the timing controller 103 and the digital-to-analog converter circuit 200.

The circuit 104 includes a plurality of digital-to-analog converter circuits 200 (shown as "DAC" in FIG. 1). Each of the digital-to-analog converter circuits 200 includes a plurality of terminals IT, a terminal OT, and a terminal LT.

The plurality of terminals IT are electrically connected to the timing controller 103, and the aforementioned signal generated by the timing controller 103 is transmitted to the terminals IT. The terminal OT is electrically connected to the display panel OP in the display portion 110, and the terminal LT is electrically connected to the display panel LP.

The number of digital-to-analog converter circuits 200 included in the circuit 104 depends on the number of pixel circuits connected to one scan line (referred to as gate line or simply as wiring in some cases) in the display panel LP.

The number of pixel circuits in the row direction and that in the column direction in the display panel OP are equal to the number of pixel circuits in the row direction and that in the column direction, respectively, in the display panel LP. In other words, the number of digital-to-analog converter circuits 200 included in the circuit 104 also depends on the number of pixel circuits selected by one selection signal line in the display panel OP.

<Method for Determining Grayscale>

Next, the description is made on a method for determining grayscale for the display device in accordance with the illuminance of external light by the threshold detector 102 and the circuit 104.

FIGS. 2A, 2B-1 to 2B-3, and 2C-1 to 2C-3 are diagrams for explaining the relation between the value of digital video data, threshold value, emission intensity of the display panel OP displaying an image, and reflection intensity of the display panel LP displaying an image. Here, 6-bit digital video data is explained as an example.

Figure 2A:
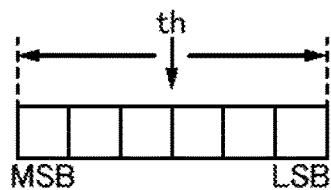

FIG. 2A schematically illustrates a signal of the digital video data. Note that MSB stands for most significant bit, LSB stands for least significant bit, and "th" represents a threshold value. The threshold value depends on illuminance measured with the illuminometer 101 and is determined by the threshold detector 102 and transferred to the timing controller 103 as grayscale information.

The timing controller 103 sets the threshold value of digital video data that is transferred to the timing controller 103 from the outside, by obtaining the threshold value from the threshold detector 102. The digital video data is divided by the threshold value as the border into a high-order bit length and a low-order bit length. The grayscale of an image to be displayed is determined with the high-order bit length contributing to the emission intensity of the display panel OP and the low-order bit length contributing to the reflection intensity of the display panel LP.

First, the case where the display device is used in a dark environment is considered. When external light is weak, the reflection intensity of the display panel LP is low, so that it is necessary to increase the emission intensity of the display panel OP. Here, in a dark environment, the second bit is assumed to be obtained as the threshold value with the illuminometer 101 and the threshold detector 102 (refer to FIG. 2B-1). That is, high-order 4 bits contribute to the emission intensity of the display panel OP and low-order 2 bits contribute to the reflection intensity of the display panel LP as described above.

In one embodiment of the present invention, the value of the high-order 4 bits is referred to when an image is displayed on the display panel OP; thus, the low-order 2 bits that are not used are shown as "00." That is, when an image is displayed on the display panel OP, digital data reflecting the threshold value is data where the high-order 4 bits are any of "0000" to "1111" and the low-order 2 bits are "00." Moreover, the low-order 2 bits are referred to when an image is displayed on the display panel LP; hence, the high-order 4 bits that are not used may be ignored. Depending on circumstances or conditions or as needed, the value of the high-order 4 bits may be freely set to any of "0000" to "1111."

Figures 1, 2B:
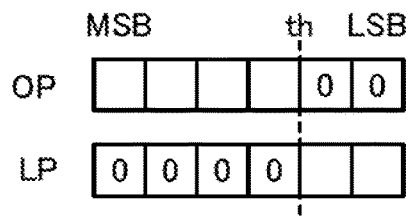
Figures 1, 2C:
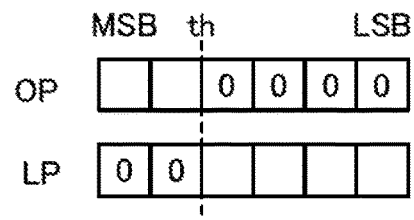
Figures 2, 2B:
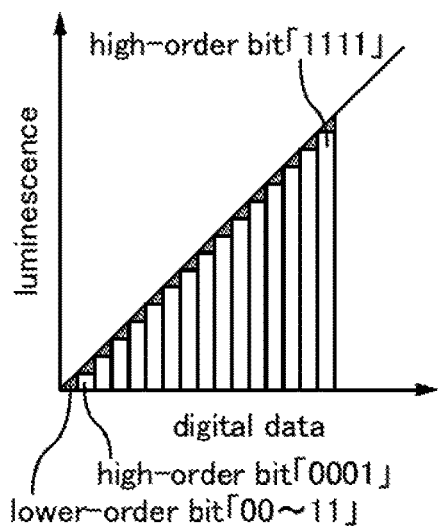
Figures 2, 2C:
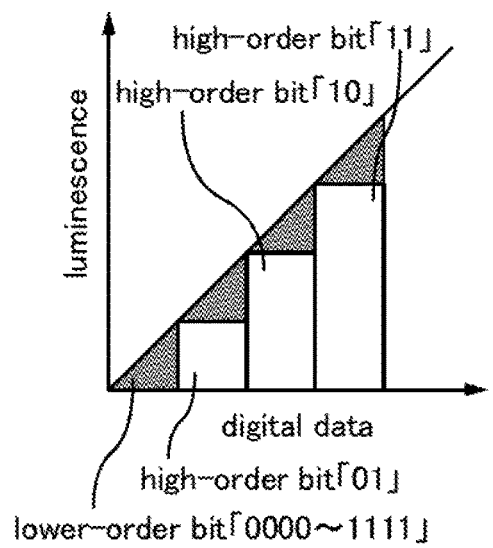

FIG. 2B-2 is a graph showing the relation between the luminance of the display device and the value of digital video data. A region without a hatching pattern represents the emission intensity of the display panel OP, and a region with a hatching pattern represents the reflection intensity of the display panel LP.

When the high-order bit length is 4 bits, the high-order bits have values from "0000" to "1111." That is, the emission intensity of the display panel OP is expressed by 16 levels from the high-order bits "0000" to "1111." From FIG. 2B-2, the emission intensity of the display panel OP increases sequentially from the high-order bits "0000." Note that the high-order bits "0000" are not shown in FIG. 2B-2 because the emission intensity of the display panel OP is 0 in this case.

The low-order bits have values from "00" to "11." That is, the reflection intensity of the display panel LP is expressed by four levels from the low-order bits "00" to "11." The luminance shown in FIG. 2B-2 is the sum of four levels of reflection intensities of the display panel LP and each of 16 levels of emission intensities of the display panel OP.

Grayscale represented by the display panel LP depends on a potential supplied to a liquid crystal element included in the display panel LP, and grayscale represented by the display panel OP depends on a potential supplied to a gate of a driving transistor included in the display panel OP. That is, the grayscale for each of the display panel LP and the display panel OP can be determined by a potential. Note that a potential used for grayscale adjustment is often different between the display panel LP and the display panel OP. Accordingly, two kinds of potentials for grayscale adjustment that are supplied to the semiconductor device 100 are prepared in one embodiment of the present invention.

Figures 2, 2B, 3:
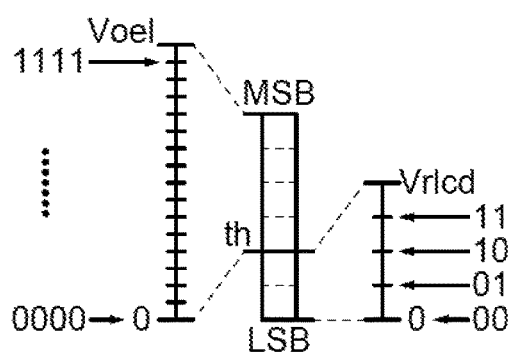
Figures 2, 2C, 3:
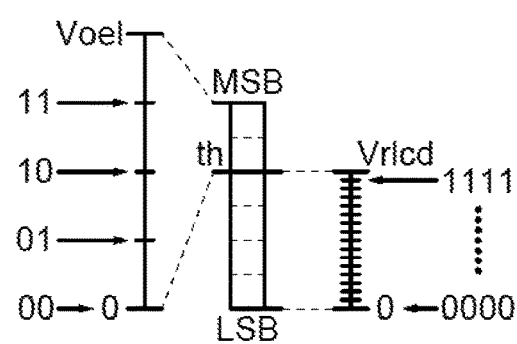

A power supply potential for adjusting grayscale for the display panel OP is denoted by Voel, and a power supply potential for adjusting grayscale for the display panel LP is denoted by Vrlcd. As described above, the grayscale for the display panel OP depends on the emission intensity, which is one of the 16 levels; thus, a potential supplied to a display element of the display panel OP is any of 16 potentials obtained by dividing the power supply potential Voel for grayscale adjustment into 16 levels (FIG. 2B-3). The grayscale for the display panel LP depends on the emission intensity, which is one of the four levels; thus, a potential supplied to a display element of the display panel LP is any of four potentials obtained by dividing the power supply potential Vrlcd for grayscale adjustment into four levels. In FIG. 2B-3, potentials at the time when the high-order 4 bits are "0000" and when the low-order 2 bits are "00" are shown as "0"; in this specification, this potential 0 is sometimes referred to as a ground (GND) potential.

Next, the case where the display device is used in a bright environment is considered. When external light is intense, the reflection intensity of the display panel LP is high, so that it is necessary to decrease the emission intensity of the display panel OP. Here, in in an environment with bright external light, the fourth bit is assumed to be obtained as the threshold value with the illuminometer 101 and the threshold detector 102 (FIG. 2C-1). That is, high-order 2 bits contribute to the emission intensity of the display panel OP, and low-order 4 bits contribute to the reflection intensity of the display panel LP.

In one embodiment of the present invention, the value of the high-order 2 bits is referred to when an image is displayed on the display panel OP; thus, the low-order 4 bits that are not used are shown as "0000." That is, when an image is displayed on the display panel OP, digital data reflecting the threshold value is any of "000000," "010000," "100000," and "110000." In addition, the low-order 4 bits are referred to when an image is displayed on the display panel LP; hence, the high-order 2 bits that are not used are "00." That is, when an image is displayed on the display panel LP, digital data reflecting the threshold value is any of "000000" to "001111."

Like FIG. 2B-2, FIG. 2C-2 is a graph showing the relation between the luminance of the display device and the value of digital video data.

When the high-order bit length is 2 bits, the high-order bits have values from "00" to "11." That is, the emission intensity of the display panel OP is expressed by four levels from the high-order bits "00" to "11." From FIG. 2C-2, the emission intensity of the display panel OP increases sequentially from the high-order bits "00." Note that the high-order bits "00" are not shown in FIG. 2C-2 because the emission intensity of the display panel OP is 0 in this case.

The low-order bits have values from "0000" to "1111." That is, the reflection intensity of the display panel LP is expressed by 16 levels from the low-order bits "0000" to "1111." The luminance shown in FIG. 2C-2 is the sum of 16 levels of reflection intensities of the display panel LP and each of four levels of emission intensities of the display panel OP.

In other words, a potential supplied to the display element of the display panel OP is any of four potentials obtained by dividing the power supply potential Voel for grayscale adjustment into four levels (FIG. 2C-3). In the display panel LP, a potential supplied to the display element is any of 16 potentials obtained by dividing the power supply potential Vrlcd for grayscale adjustment into 16 levels. In FIG. 2C-3, potentials at the time when the high-order 2 bits are "00" and when the low-order 4 bits are "0000" are shown as "0"; in this specification, this potential 0 is sometimes referred to as the GND potential.

<Configuration Examples of Digital-to-Analog Converter Circuit 200>

Next, configuration examples of the digital-to-analog converter circuit 200 will be described. As has been described, the digital-to-analog converter circuit 200 needs to be capable of generating a grayscale signal intended for the display panel OP and a grayscale signal intended for the display panel LP.

FIG. 3A illustrates a digital-to-analog converter circuit 250 to show a configuration example of the digital-to-analog converter circuit 200. The digital-to-analog converter circuit 250 is an example of a resistor string digital-to-analog converter circuit and has a function of converting an n-bit digital signal (n is an integer of 2 or more) into an analog signal. The digital-to-analog converter circuit 250 includes an amplifier circuit AMP, a switch OLSW, a switch BSW, a switch SOSW, a switch SLSW, switches SWd1[1] to SWd1[$n-1$], switches SWd2[1] to SWd2[$n-1$], a pass transistor logic circuit PTL, circuits RS[1] to RS[n], and bus lines BS[1] to BS[n].

The switch OLSW, the switch SOSW, the switches SWd1[1] to SWd1[$n-1$], and the switches SWd2[1] to SWd2[$n-1$] are each a switch whose two terminals are electrically connected or disconnected. The switch BSW has first to third terminals, and the first terminal has a function of being electrically connected to one of the second and third terminals. That is, the switch BSW has a function of a selector.

The bus line BS[1] includes two wirings. The bus line BS[j] (j is an integer of 2 to n) includes $2^{j-1}$ wirings.

FIG. 3B-1 illustrates a configuration example of the circuit RS[1]. The circuit RS[1] includes a resistor R[1]_1, a resistor R[1]_2, a terminal RT1, a terminal RT2, and a terminal group PTS[1]. The terminal group PTS[1] includes a terminal PT[1]_1 and a terminal PT[1]_2. One terminal of the resistor R[1]_1 is electrically connected to the terminal RT1 of the circuit RS[1]. The other terminal of the resistor R[1]_1 is electrically connected to one terminal of the resistor R[1]_2. The other terminal of the resistor R[1]_2 is electrically connected to the terminal RT2 of the circuit RS[1]. The terminal PT[1]_1 is electrically connected to the one terminal of the resistor R[1]_1. The terminal PT[1]_2 is electrically connected to the one terminal of the resistor R[1]_2.

FIG. 3B-2 illustrates a configuration example of the circuit RS[j]. The circuit RS[j] includes resistors R[j]_1 to R[j]_$2^{j-1}$, the terminal RT1, the terminal RT2, and a terminal group PTS[j]. The terminal group PTS[j] includes terminals PT[j]_1 to PT[j]_$2^{j-1}$. One terminal of the resistor R[j]_1 is electrically connected to the terminal RT1 of the circuit RS[j]. One terminal of the resistor R[j]_k (k is an integer of 2 to $2^{j-1}$) is electrically connected to the other terminal of the resistor R[j]_(k-1). The other terminal of the resistor R[j]_$2^{j-1}$ is electrically connected to the terminal RT2 of the circuit RS[j]. The terminal PT[1] is electrically connected to the resistor R[j]_1. The terminal PT[k] is electrically connected to the resistor R[j]_k.

In other words, in each of the circuits RS[1] and RS[j], the resistors are connected in series. Note that all the resistors R[1]_1, R[1]_2, and R[j]_1 to R[j]_$2^{j-1}$ preferably have the same resistance.

The pass transistor logic circuit PTL has an input terminal group ITS and an output terminal OUT. The pass transistor logic circuit PTL has a function of outputting one of signals supplied to terminals of the input terminal group ITS to the output terminal OUT in accordance with digital data input thereto.

The terminal RT1 of the circuit RS[1] is electrically connected to a wiring GNDL. The terminal RT2 of the circuit RS[1] is electrically connected to one terminal of the switch SWd1[1] and one terminal of the switch SWd2[1].

The terminal RT1 of the circuit RS[h] (h is an integer of 2 to n-1) is electrically connected to the other terminal of the switch SWd1[h-1]. The terminal RT2 of the circuit RS[h] is electrically connected to one terminal of the switch SWd1[h], one terminal of the switch SWd2[h], and the other terminal of the switch SWd2[h-1].

The terminal RT1 of the circuit RS[n] is electrically connected to the other terminal of the switch SWd1[n-1]. The terminal RT2 of the circuit RS[n] is electrically connected to the other terminal of the switch SWd2[n-1], one terminal of the switch SOSW, and one terminal of the switch SLSW.

A wiring VOL is electrically connected to the other terminal of the switch SOSW. A wiring VLL is electrically connected to the other terminal of the switch SLSW.

The terminal PT[1]_1 and the terminal PT[1]_2 of the circuit RS[1] are electrically connected to some terminals of the input terminal group ITS in the pass transistor logic circuit PTL through the bus line BS[1]. The terminals PT[j]_1 to PT[j]_$2^{j-1}$ of the circuit RS[j] are electrically connected to some other terminals of the input terminal group ITS in the pass transistor logic circuit PTL through the bus line BS[j]. The output terminal OUT of the pass transistor logic circuit PTL is electrically connected to an input terminal AIT of the amplifier circuit AMP.

The amplifier circuit AMP amplifies a potential supplied to the input terminal AIT and outputs the amplified potential to an output terminal AOT. In one embodiment of the present invention, the amplification factor of the amplifier circuit AMP is 1. Note that the amplification factor of the amplifier circuit AMP is not limited to 1 in one embodiment of the present invention and may be changed depending on conditions or circumstances or as needed. For example, the amplification factor of the amplifier circuit AMP may be less than 1 or greater than 1.

The output terminal AOT of the amplifier circuit AMP is electrically connected to one terminal of the switch OLSW. The first terminal of the switch BSW is electrically connected to the other terminal of the switch OLSW. The second terminal of the switch BSW is electrically connected to the terminal OT. The third terminal of the switch BSW is electrically connected to the terminal LT.

The wiring VOL is a wiring for supplying the potential Voel for the display panel OP. The wiring VLL is a wiring for supplying the potential Vrlcd for the display panel LP. The wiring GNDL is a wiring for supplying a ground potential (GND potential).

In other words, the potential Voel or the potential Vrlcd is input to the terminal RT2 of the circuit RS[n] or the other terminal of the switch SWd2[n-1]. The digital-to-analog converter circuit 250 generates analog data from the potential input to the terminal RT2 of the circuit RS[n] or the other terminal of the switch SWd2[n-1], on the basis of digital data.

Note that FIG. 3A only illustrates the amplifier circuit AMP, the input terminal AIT, the output terminal AOT, the terminal OT, the terminal LT, the input terminal group ITS, the output terminal OUT, the switch OLSW, the switch BSW, the switch SOSW, the switch SLSW, the switch SWd1[1], the switch SWd2[1], the switch SWd1[2], the switch SWd2[2], the switch SWd1[j], the switch SWd2[j], the switch SWd1[n-1], the switch SWd2[n-1], the circuit RS[1], the circuit RS[2], the circuit RS[j], the circuit RS[n], the terminal RT1, the terminal RT2, the terminal group PTS[1], the terminal group PTS[2], the terminal group PTS[j], the terminal group PTS[n], the bus line BS[1], the bus line BS[2], the bus line BS[j], the bus line BS[n], the wiring VOL, the wiring VLL, and the wiring GNDL; other circuits, elements, and wirings and their reference numerals are omitted.

Figure 4:
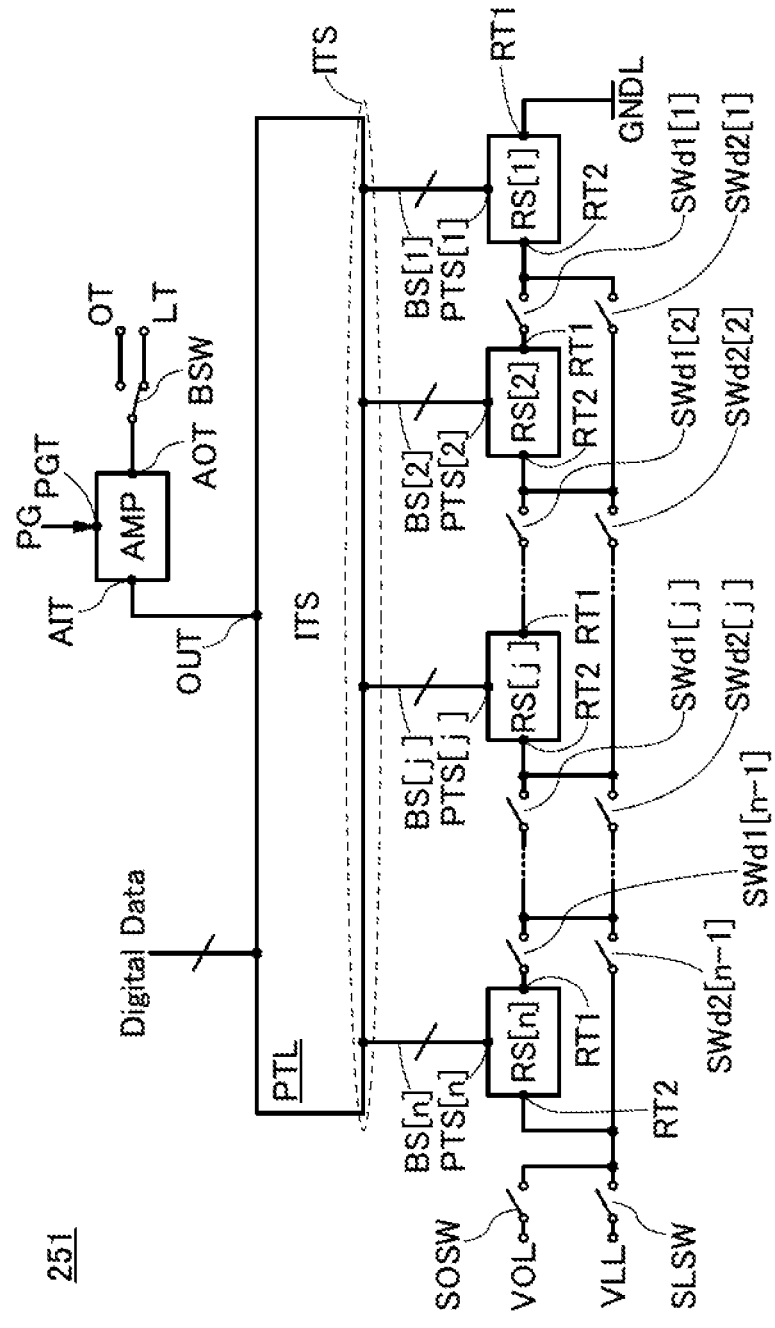
FIG. 4 is a circuit diagram illustrating an example of a semiconductor device.

Note that the digital-to-analog converter circuit of one embodiment of the present invention is not limited to the digital-to-analog converter circuit 250 shown in FIGS. 3A, 3B-1, and 3B-2. Depending on circumstances or conditions or as needed, the configuration of the digital-to-analog converter circuit 250 can be changed. For example, when a wiring for supplying a power supply potential to the amplifier circuit AMP is provided with a switch (i.e., when the amplifier circuit AMP is provided with a switch for power gating), the digital-to-analog converter circuit 250 may be configured such that the output terminal AOT of the amplifier circuit AMP is electrically connected directly to the first terminal of the switch BSW without providing the switch OLSW. FIG. 4 illustrates a circuit configuration in this case. The amplifier circuit AMP included in a digital-to-analog converter circuit 251 has a terminal PGT that is electrically connected to a wiring PG. The wiring PG is a wiring for controlling opening and closing of the switch for power gating in the amplifier circuit AMP. With this structure, when the digital-to-analog converter circuit 251 does not transmit analog data to the display panel OP and the display panel LP, supply of analog data to the display panel OP and the display panel LP can be stopped by turning off the switch for power gating in the amplifier circuit AMP (i.e., by stopping the operation of the amplifier circuit AMP) by the wiring PG.

Figure 5:
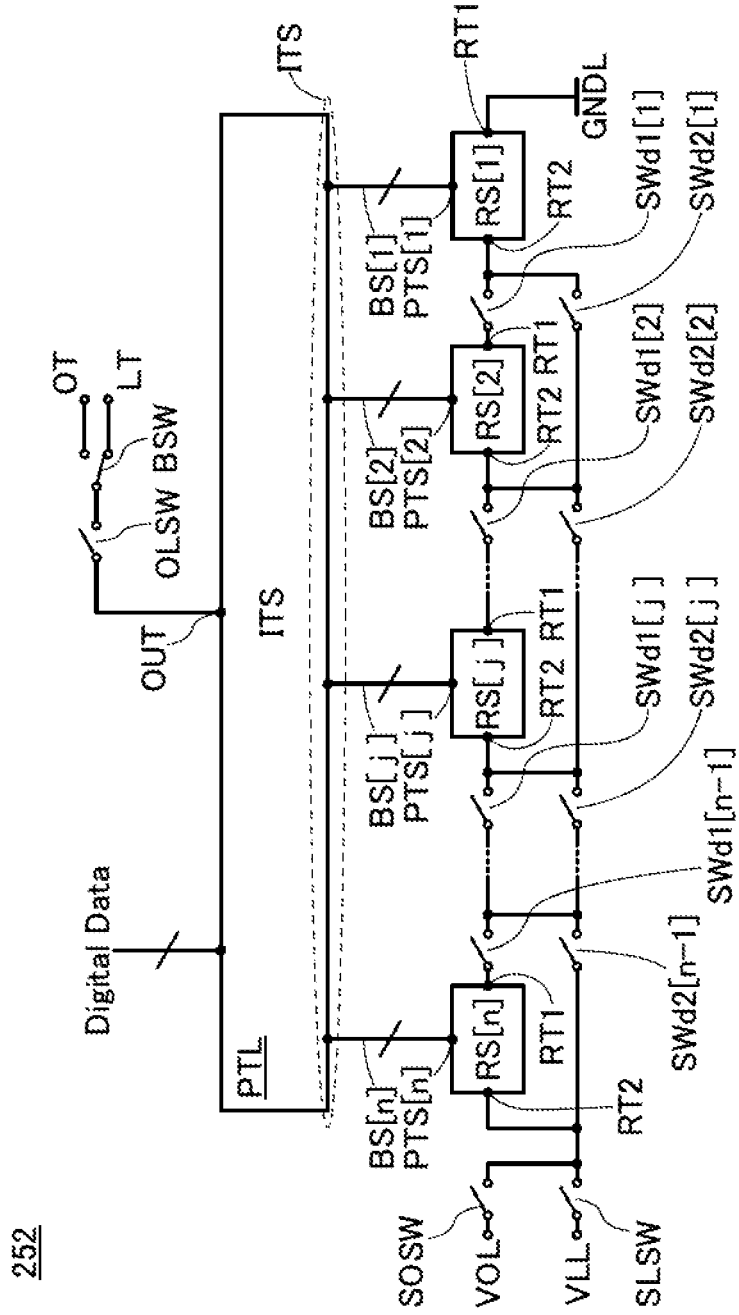
FIG. 5 is a circuit diagram illustrating an example of a semiconductor device.

As another example, when it is not necessary to amplify analog data to be output to the terminal OT or the terminal LT, the amplifier circuit AMP may be omitted from the digital-to-analog converter circuit 250 or the digital-to-analog converter circuit 251. FIG. 5 illustrates a circuit configuration in this case. A digital-to-analog converter circuit 252 does not have the amplifier circuit AMP; thus, employing the digital-to-analog converter circuit 252 can reduce the circuit area of the digital-to-analog converter circuit 200.

Figure 6:
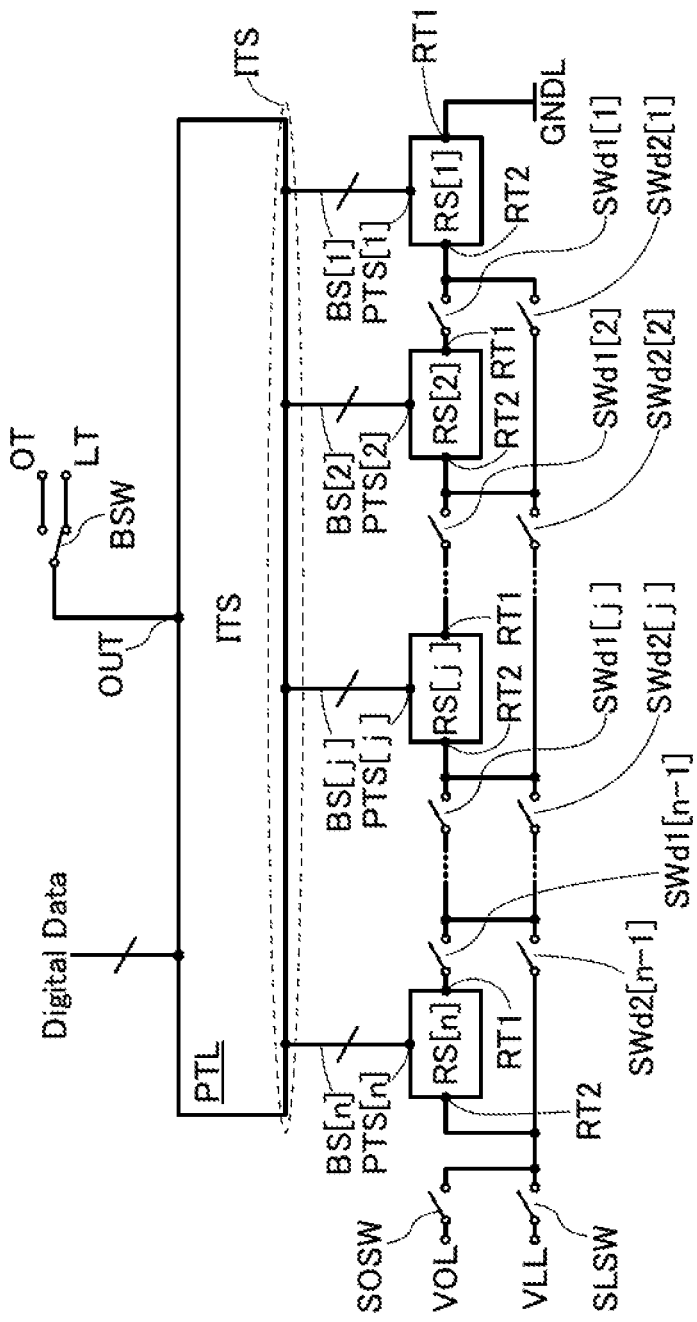
FIG. 6 is a circuit diagram illustrating an example of a semiconductor device.

As another example, the switch OLSW can be omitted when the switch BSW in the digital-to-analog converter circuit 252 has a function of electrically connecting the first terminal to one of the second and third terminals and a function of not electrically connecting the first terminal to the second terminal or the third terminal. FIG. 6 illustrates a circuit configuration in this case. A digital-to-analog converter circuit 253 does not have the switch OLSW; thus, employing the digital-to-analog converter circuit 253 can reduce the circuit area of the digital-to-analog converter circuit 200 more than in the case of using the digital-to-analog converter circuit 252.

As switches such as the switch OLSW, the switch SOSW, the switch SLSW, the switch SWd1[1], the switch SWd2[1], the switch SWd1[2], the switch SWd2[2], the switch SWd1[j], the switch SWd2[j], the switch SWd1[n−1], and the switch SWd2[n−1], an electrical switch, a mechanical switch, a microelectromechanical systems (MEMS) element, and the like may be used. For example, a transistor is preferably used as an electrical switch. Particularly when an n-channel transistor is used, a channel formation region of the transistor preferably contains an oxide containing at least one of indium, an element M (aluminum, gallium, yttrium, or tin), and zinc. That is, an OS transistor is preferably used.

Any two of the above circuit configuration examples can be combined with each other as appropriate.

<Operation Example of Digital-to-Analog Converter Circuit 250>

Next, an operation example of the digital-to-analog converter circuit 250 will be described.

Figure 7:
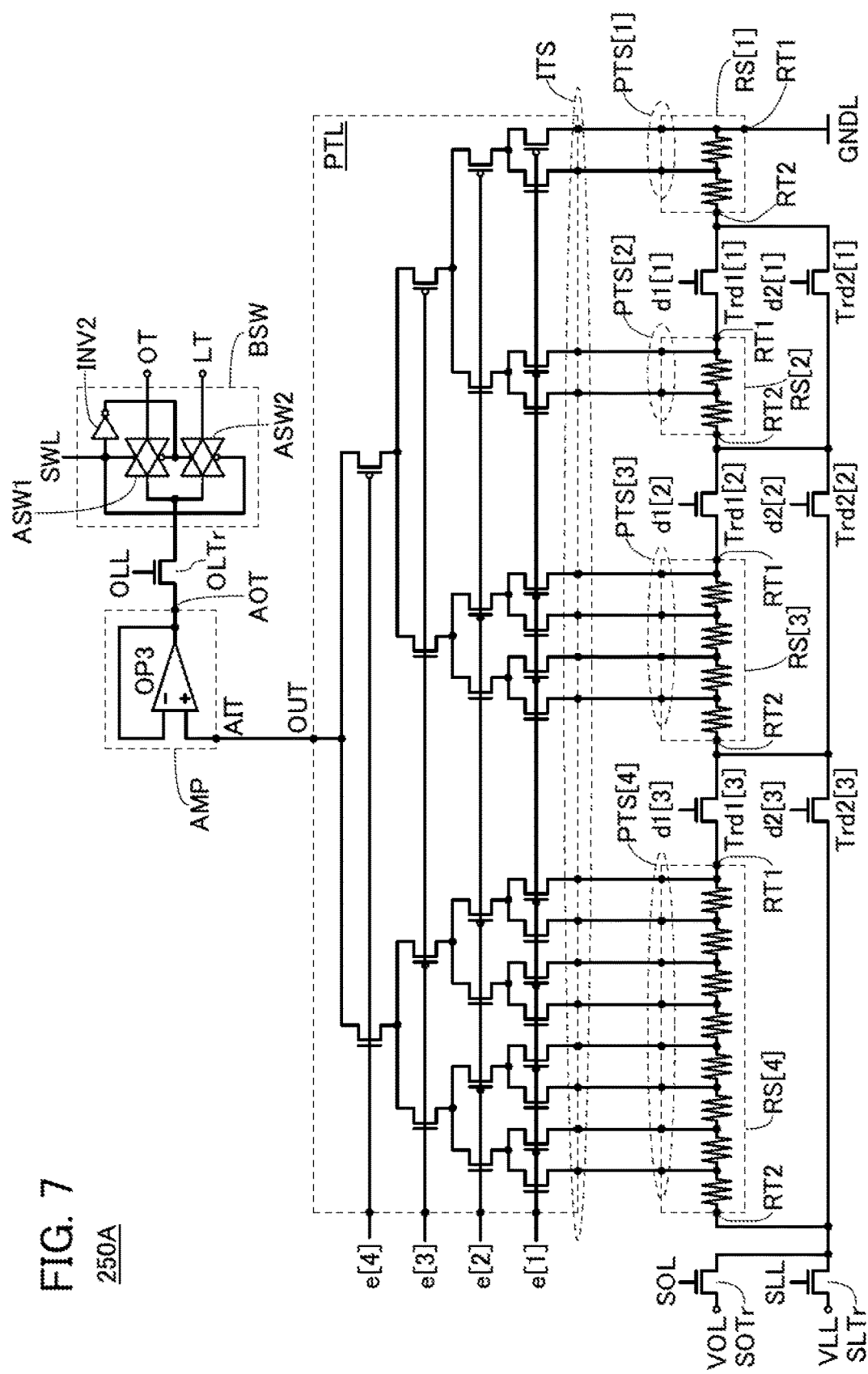
FIG. 7 is a circuit diagram illustrating an example of a semiconductor device.

In this operation example, for simplicity, the operation of not the digital-to-analog converter circuit 250 but a digital-to-analog converter circuit 250A shown in FIG. 7 is described as an example.

The digital-to-analog converter circuit 250A is an example of a circuit that converts a 4-bit digital signal into an analog signal. That is, in the digital-to-analog converter circuit 250A, n in the digital-to-analog converter circuit 250 is four. This means that the digital-to-analog converter circuit 250A includes circuits RS[1] to RS[4]. The circuit RS[1], the circuit RS[2], the circuit RS[3], and the circuit RS[4] include the terminal group PTS[1], the terminal group PTS[2], a terminal group PTS[3], and a terminal group PTS[4], respectively. As described using FIGS. 3B-1 and 3B-2, the terminal group PTS[1] includes the terminal PT[1]_1 and the terminal PT[1]_2; the terminal group PTS[2] includes a terminal PT[2]_1 and a terminal PT[2]_2; the terminal group PTS[3] includes terminals PT[3]_1 to PT[3]_4; and the terminal group PTS[4] includes terminals PT[4]_1 to PT[4]_8. Note that in FIG. 7, reference numerals of the terminal PT[1]_1, the terminal PT[1]_2, the terminal PT[2]_1, the terminal PT[2]_2, the terminals PT[3]_1 to PT[3]_4, and the terminals PT[4]_1 to PT[4]_8 are omitted.

In the digital-to-analog converter circuit 250A, the switch OLSW, the switch SOSW, the switch SLSW, the switches SWd1[1] to SWd1[n−1], and the switches SWd2[1] to SWd2[n−1] in the digital-to-analog converter circuit 250 are replaced with a transistor OLTr, a transistor SOTr, a transistor SLTr, transistors Trd1[1] to Trd1[3], and transistors Trd2[1] to Trd2[3], respectively.

To control the on/off state of the above transistors, a wiring is connected to a gate of each transistor. Specifically, the gate of the transistor OLTr is electrically connected to a wiring OLL. The gate of the transistor SOTr is electrically connected to a wiring SOL. The gate of the transistor SLTr is electrically connected to a wiring SLL. The gates of the transistors Trd1[1] to Trd1[3] are electrically connected to the respective wirings d1[1] to d1[3]. The gates of the transistors Trd2[1] to Trd2[3] are electrically connected to the respective wirings d2[1] to d2[3].

The switch BSW in the digital-to-analog converter circuit 250A includes an analog switch ASW1, an analog switch ASW2, and an inverter circuit INV2. The first terminal of the switch BSW is electrically connected to a first input/output terminal of the analog switch ASW1 and a first input/output terminal of the analog switch ASW2. The second terminal of the switch BSW is electrically connected to a second input/output terminal of the analog switch ASW1. The third terminal of the switch BSW is electrically connected to a second input/output terminal of the analog switch ASW2. A wiring SWL is electrically connected to a first control terminal the analog switch ASW1, a first control terminal the analog switch ASW2, and an input terminal of the inverter circuit INV2. An output terminal of the inverter circuit INV2 is electrically connected to a second control terminal the analog switch ASW1 and a second control terminal the analog switch ASW2.

The wiring SWL is a wiring for controlling switching of the switch BSW. When a high-level potential is input to the wiring SWL, electrical continuity is established between the input terminal of the switch BSW and the terminal OT, and electrical continuity is not established between the input terminal of the switch BSW and the terminal LT. When a low-level potential is input to the wiring SWL, electrical continuity is established between the input terminal of the switch BSW and the terminal LT, and electrical continuity is not established between the input terminal of the switch BSW and the terminal OT.

The amplifier circuit AMP in the digital-to-analog converter circuit 250A includes an operational amplifier OP3. A non-inverting input terminal of the operational amplifier OP3 is electrically connected to the input terminal AIT. An output terminal of the operational amplifier OP3 is electrically connected to the output terminal AOT. An inverting input terminal of the operational amplifier OP3 is electrically connected to the output terminal of the operational amplifier OP3. That is, the operational amplifier OP3 is configured to serve as a voltage follower circuit.

The pass transistor logic circuit PTL in the digital-to-analog converter circuit 250A is composed of four-stage pass transistors. Specifically, in the pass transistor logic circuit PTL, each path electrically branches into two paths in every stage; thus, the pass transistor logic circuit PTL includes $2^4(=16)$ paths between the output terminal OUT and input terminals. That is, the input terminal group ITS in the pass transistor logic circuit PTL has 16 input terminals. Note that one of the two branching paths in every stage is electrically connected to one of a source and a drain of an n-channel transistor, and the other path is electrically connected to one of a source and a drain of a p-channel transistor. Gates of the transistors provided in a q-th stage (q is an integer of 1 to 4) are electrically connected to a wiring e[q]. The terminal group PTS[1], the terminal group PTS[2], the terminal group PTS[3], and the terminal group PTS[4] are electrically connected to the input terminal group ITS.

The above configuration makes it possible to provide a circuit for converting digital data into analog data. Specifically, when a potential corresponding to digital data is supplied to wirings e[1] to e[4], the circuit can select any of the potentials supplied to the input terminal group ITS and output the selected potential to the output terminal OUT.

Next, an operation example of the digital-to-analog converter circuit 250A will be described with reference to a timing chart shown in FIG. 8.

Figure 8:
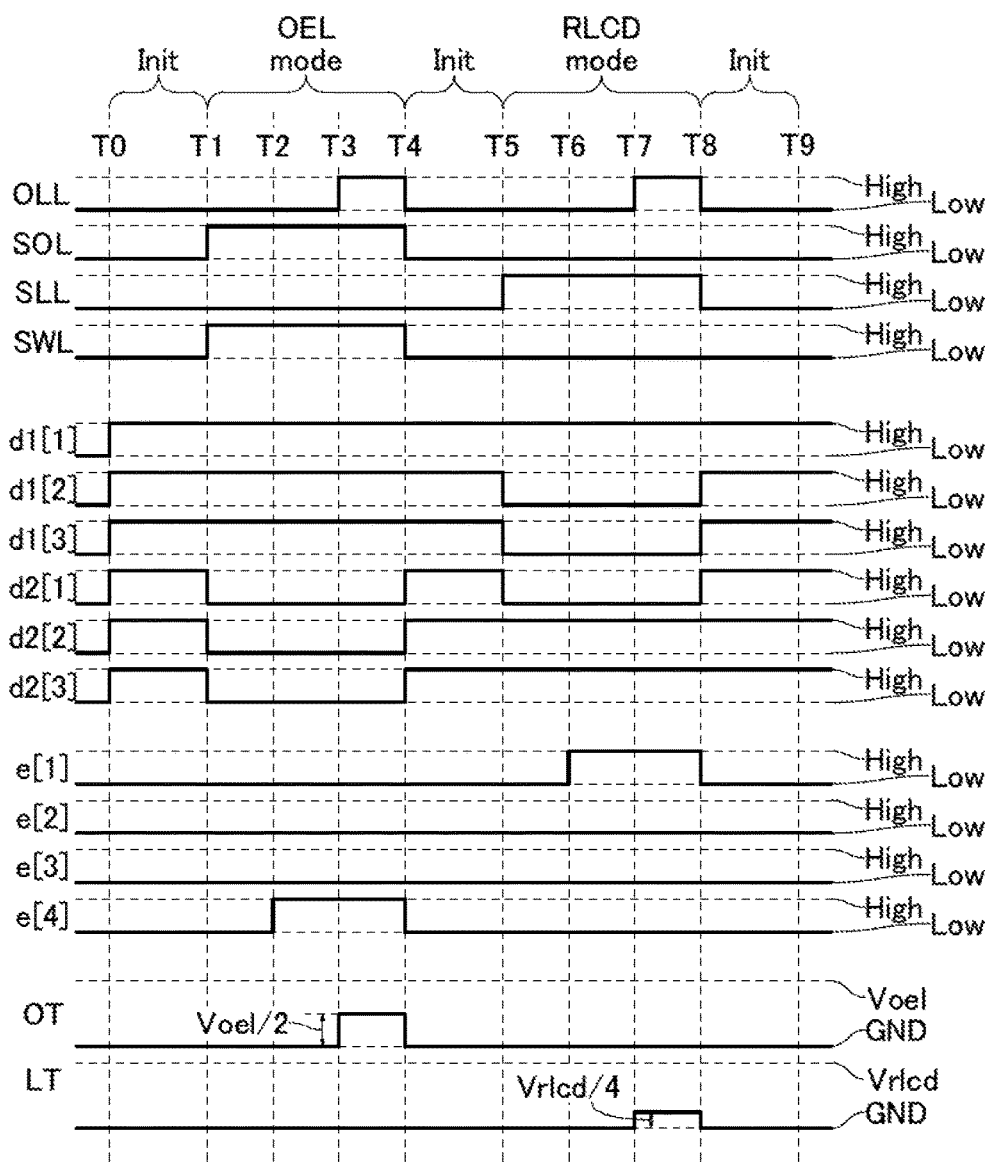
FIG. 8 is a timing chart showing an operation example of a semiconductor device.

The timing chart in FIG. 8 shows changes in potentials of the wiring OLL, the wiring SOL, the wiring SLL, the wiring SWL, the wirings d1[1] to d1[3], the wirings d2[1] to d2[3], the wirings e[1] to e[4], the terminal OT, and the terminal LT. The wiring OLL, the wiring SOL, the wiring SLL, the wiring SWL, the wirings d1[1] to d1[3], the wirings d2[1] to d2[3], and the wirings e[1] to e[4] are each supplied with one of a high-level potential ("High" in FIG. 8) and a low-level potential ("Low" in FIG. 8). Note that potentials supplied to the wiring OLL, the wiring SOL, the wiring SLL, the wiring SWL, the wirings d1[1] to d1[3], the wirings d2[1] to d2[3], and the wirings e[1] to e[4] are not limited to the high-level potential and the low-level potential and may be an analog potential.

The wiring OLL, the wiring SOL, the wiring SLL, the wiring SWL, the wirings d1[1] to d1[3], the wirings d2[1] to d2[3], and the wirings e[1] to e[4] are electrically connected to the timing controller 103 through the plurality of terminals IT. In other words, digital video data input to the digital-to-analog converter circuit 250A, the threshold value of the digital video data corresponding to the illuminance of external light, and a signal that selects a display mode for driving the display portion 110 are transmitted through the wiring OLL, the wiring SOL, the wiring SLL, the wiring SWL, the wirings d1[1] to d1[3], the wirings d2[1] to d2[3], and the wirings e[1] to e[4].

<<Initialization>>

First, initialization operation is described. This operation is performed before video data is transmitted to the display panel OP or the display panel LP. Specifically, potentials supplied to resistors of a resistor string that is configured with the circuits RS[1] to RS[4] in the digital-to-analog converter circuit 250A are set to 0. Note that a period for initialization is shown by "Init" in the timing chart of FIG. 8; the initialization operation is performed in a period from the time T0 to the time T1.

From the time T0 to the time T1, the low-level potential is supplied to the wiring SOL, the wiring SLL, and the wiring OLL. Thus, the transistor SOTr, the transistor SLTr, and the transistor OLTr are turned off In addition, from the time T0 to the time T1, the high-level potential is supplied to the wirings d1[1] to d1[3] and the wirings d2[1] to d2[3]. Thus, the transistors Trd1[1] to Trd1[3] and the transistors Trd2[1] to Trd2[3] are turned on. Accordingly, a potential between the terminal RT1 and the terminal RT2 in each of the circuits RS[1] to RS[4] can be set to 0.

Since the transistor OLTr is off in this period, a signal is not output from the terminal OT or the terminal LT. For this reason, a potential supplied to the wiring SWL can be either the high-level potential or the low-level potential (the potential of the wiring SWL is the low-level potential in the timing chart of FIG. 8).

Similarly, since the transistor OLTr is off, a signal is not output from the terminal OT or the terminal LT even if given video data is input to the digital-to-analog converter circuit 250A. For this reason, a potential supplied to each of the wirings e[1] to e[4] can be either the high-level potential or the low-level potential (the potentials of the wirings e[1] to e[4] are the low-level potential in the timing chart of FIG. 8).

<<OEL Mode>>

Next, the description is made on an example of operation of the digital-to-analog converter circuit 250A for displaying an image on the display panel OP after the initialization operation. In a period from the time T1 to the time T2, the threshold value of digital video data that is assigned to each source line by the timing controller 103 is set in accordance with external light. Thus, grayscale expressed by the digital video data is set. Then, a digital signal based on the threshold value, the digital video data, and the display mode (the self-luminous mode, or an OEL mode) is transmitted to the digital-to-analog converter circuit 250A. The digital signal transmitted to the digital-to-analog converter circuit 250A is converted into an analog signal and the analog signal is transmitted to the display panel OP, whereby an image with adjusted grayscale can be displayed on the display panel OP.

For example, the assumption is made that at the time T1, digital video data assigned to a given source line is "1001," and the threshold value determined by external light intensity is the low-order second bit (second LSB). That is, high-order 2 bits of the digital video data contribute to the emission intensity of the display panel OP; thus, an analog value output from the terminal OT of the digital-to-analog converter circuit 250A that is electrically connected to the given source line is a value obtained by digital-to-analog conversion of digital video data "1000."

From the time T1 to the time T2, the high-level potential is supplied to the wiring SOL, and the low-level potential is supplied to the wiring SLL. Thus, the transistor SOTr is turned on and the transistor SLTr is turned off. Moreover, the high-level potential is supplied to the wiring SWL; hence, electrical continuity is established between the first and second terminals of the switch BSW but not between the first and third terminals of the switch BSW.

Moreover, from the time T1 to the time T2, the high-level potential is supplied to the wirings d1[1] to d1[3], and the low-level potential is supplied to the wirings d2[1] to d2[3]. Thus, the transistors Trd1[1] to Trd1[3] are turned on and the transistors Trd2[1] to Trd2[3] are turned off. In other words, the voltage of a section between the terminal RT2 of the circuit RS[4] and the terminal RT1 of the circuit RS[1] becomes Voel. Note that in this operation example, a voltage drop between a source and a drain of each of the transistors Trd1[1] to Trd1[3] is ignored to simplify the explanation.

Note that in each of FIGS. 3 to 6, in the OEL mode, the switches SWd1[1] to SWd1[n−1] are on and the switches SWd2[1] to SWd2[n−1] are off regardless of the threshold value. That is, in the circuit configuration of FIG. 7 and in this operation example, the transistors Trd1[1] to Trd1[3] are on and the transistors Trd2[1] to Trd2[3] are off in the OEL mode.

From the time T2 to the time T3, potentials corresponding bits of the digital video data "1000" are supplied to the respective wirings e[1] to e[4]. Specifically, when the q-th digit is "1," the high-level potential is supplied to the wiring e[q]; whereas when the q-th digit is "0," the low-level potential is supplied to the wiring e[q]. That is, the low-level potential is supplied to the wiring e[1], the wiring e[2], and the wiring e[3], whereas the high-level potential is supplied to the wiring e[4].

Consequently, in the input terminal group ITS of the pass transistor logic circuit PTL, only the terminal electrically connected to the terminal PT[4]_1 of the circuit RS[4] establishes electrical continuity with the output terminal OUT of the pass transistor logic circuit PTL. That is, the potential of the terminal PT[4]_1 of the circuit RS [4] is output from the output terminal OUT of the pass transistor logic circuit PTL and input to the non-inverting input terminal of the operational amplifier OP3.

Here, the potential of the terminal PT[4]_1 of the circuit RS [4] is considered. The number of resistors included in the circuits RS[1] to RS[4] is 16. The resistors included in the circuits RS[1] to RS[4] have the same resistance; given that this resistance is denoted by R, the total resistance of the resistor string between the terminal RT1 of the circuit RS[1] and the terminal RT2 of the circuit RS[4] is 16R. In the resistor string composed of the circuits RS[1] to RS[4], the terminal PT[4]_1 is placed following the eighth resistor among the 16 resistors from the wiring GNDL side. That is, the total resistance from the terminal RT1 of the circuit RS[1] to the terminal PT[4]_1 of the circuit RS[4] is 8R. Accordingly, the potential of the terminal PT[4]_1 is (8R/16R)×Voel=Voel/2.

From the time T3 to the time T4, the high-level potential is supplied to the wiring OLL. Thus, the transistor OLTr is turned on, and electrical continuity is established between the output terminal of the operational amplifier OP3 and the first terminal of the switch BSW. As a result, the potential Voel/2 is output from the terminal OT.

In the above explanation, the value of digital video data is "1001," and the threshold value is the second LSB. Next, the description is made on a potential output from the terminal OT when digital video data has a given value and its threshold value is the second LSB. In this case also, all bits of the digital video data lower than the threshold value are "0"; hence, the low-level potential is supplied to the wiring e[1] and the wiring e[2], which correspond to the low-order 2 bits. The high-order 2 bits (the value of the third and fourth digits) are any of four values of "00" to "11"; thus, potentials corresponding to the values of the respective bits are input to the wirings e[3] and e[4] (specifically, as described above, the high-level potential is supplied to the wiring e[q] when the q-th digit is "1," whereas the low-level potential is supplied to the wiring e[q] when the q-th digit is "0"). In other words, when the threshold value is set to the second LSB, the power supply potential Voel can be equally divided into four levels, and a potential output from the terminal OT is determined as one of the four levels in accordance with the value of the high-order 2 bits. Specifically, the GND potential, Voel/4, Voel/2, and Voel×3/4 are output from the terminal OT in accordance with the respective values "00" to "11" of the high-order 2 bits.

Next, the description is made on the case where digital video data has a given value and its threshold value is the low-order 1 bit (LSB). When the threshold value is the LSB, the high-order 3 bits (the value of the second, third, and fourth digits) of the digital video data contribute to the emission intensity of the display panel OP. That is, the high-order 3 bits are any of "000" to "111"; thus, potentials corresponding to the values of the respective bits are input to the wirings e[2], e[3], and e[4]. Meanwhile, since all bits of the digital video data lower than the threshold value are "0," the low-level potential is supplied to the wiring e[1], which corresponds to the LSB. Note that in the OEL mode, the transistors Trd1[1] to Trd1[3] are on and the transistors Trd2[1] to Trd2[3] are off regardless of the threshold value; hence, the voltage of the section between the terminal RT2 of the circuit RS[4] and the terminal RT1 of the circuit RS[1] becomes Voel. Accordingly, when the threshold value is set to the LSB, the power supply potential Voel can be equally divided into eight levels, and a potential output from the terminal OT is determined as one of the eight levels in accordance with the value of the high-order 3 bits. Specifically, the GND potential, Voel/8, Voel/4, Voel×3/8, Voel/2, Voel×5/8, Voel×3/4, and Voel×7/8 are output from the terminal OT in accordance with the respective values "000" to "111" of the high-order 3 bits.

Next, the description is made on the case where digital video data has a given value and its threshold value is the low-order third bit (third LSB). When the threshold value is the third LSB, the high-order 1 bit (or MSB, the value of the fourth digit) of the digital video data contributes to the emission intensity of the display panel OP. That is, the MSB is either "0" or "1"; thus, a potential corresponding to the value of the bit is input to the wiring e[4]. Meanwhile, since all bits of the digital video data lower than the threshold value are "0," the low-level potential is supplied to the wirings e[1] to e[3], which corresponds to the low-order 3 bits. Note that in the OEL mode, the switches SWd1[1] to SWd1[n−1] are on and the switches SWd2[1] to SWd2[n−1] are off regardless of the threshold value; hence, the voltage of the section between the terminal RT2 of the circuit RS[4] and the terminal RT1 of the circuit RS[1] becomes Voel. Accordingly, when the threshold value is set to the third LSB, the power supply potential Voel can be equally divided into two levels, and a potential output from the terminal OT is determined as one of the two levels in accordance with the value of the MSB. Specifically, the GND potential and Voel/2 are output from the terminal OT in accordance with the respective values "0" and "1" of the MSB.

Performing the operations from the time T1 to the time T4 in the above manner enables a grayscale signal corresponding to an ambient light environment to be transmitted to the display panel OP.

From the time T4 to the time T5, the low-level potential is supplied to the wiring OLL, the wiring SOL, the wiring SLL, the wiring SWL, and the wirings e[1] to e[4], and the high-level potential is supplied to the wirings d1[1] to d1[3] and the wirings d2[1] to d2[3]. That is, the potentials of the above wirings are set the same as those supplied from the time T0 to the time T1, whereby initialization can be performed again.

When the grayscale signal is supplied to a pixel included in the display panel OP, a channel formation region of a selection transistor in the pixel preferably contains an oxide that contains at least one of indium, the element M (any of aluminum, gallium, yttrium, and tin), and zinc. That is, the selection transistor is preferably an OS transistor. The use of an OS transistor enables the off-state current of the selection transistor to be extremely low; thus, grayscale information written to the pixel can be retained for a long time. In other words, the number of rewrite operations of grayscale information to pixels in the display panel OP by the digital-to-analog converter circuit 250A can be reduced in the OEL mode.

Grayscale information written to the pixel can be retained for a long time; therefore, before the next transmission of a grayscale signal to the display panel OP, another grayscale signal, which is different from that for the display panel OP, can be transmitted to a pixel in the display panel LP. Thus, both the display panel OP and the display panel LP can concurrently display an image with grayscale corresponding to the ambient light environment.

<<RLCD Mode>>

Next, the description is made on an example of operation of the digital-to-analog converter circuit 250A for displaying an image on the display panel LP. In a period from the time T5 to the time T6, the threshold value of digital video data that is assigned to each source line by the timing controller 103 is set in accordance with external light. Thus, grayscale expressed by the digital video data is set. Then, a digital signal based on the threshold value, the digital video data, and the display mode (the reflective mode, or an RLCD mode) is transmitted to the digital-to-analog converter circuit 250A. The digital signal transmitted to the digital-to-analog converter circuit 250A is converted into an analog signal and the analog signal is transmitted to the display panel LP, whereby an image with adjusted grayscale can be displayed on the display panel LP.

For example, the following assumption is made: at the time T5, digital video data transmitted to a given source line is "1001," which is the same as at the time T1; and the threshold value determined by external light intensity is the second LSB, which is also the same as at the time T1. That is, low-order 2 bits of the digital video data contribute to the reflection intensity of the display panel LP; thus, an analog value output from the terminal LT of the digital-to-analog converter circuit 250A that is electrically connected to the given source line is a value obtained by digital-to-analog conversion of digital video data "01." Note that although the high-order 2 bits do not distribute to the reflection intensity of the display panel LP, 4-bit data needs to be input to operate the digital-to-analog converter circuit 250A, which is a 4-bit digital-to-analog converter circuit. In view of this, a high-order bit higher than the threshold value is set to "0" in one embodiment of the present invention. As a result, digital video data input to the digital-to-analog converter circuit 250A is "0001."

From the time T5 to the time T6, the low-level potential is supplied to the wiring SOL, and the high-level potential is supplied to the wiring SLL. Thus, the transistor SOTr is turned off and the transistor SLTr is turned on. Moreover, the low-level potential is supplied to the wiring SWL; hence, electrical continuity is established between the first and third terminals of the switch BSW but not between the first and second terminals of the switch BSW.

Moreover, from the time T5 to the time T6, the high-level potential is supplied to the wiring d1[1], and the low-level potential is supplied to the wirings d1[2] to d1[3]. Furthermore, the low-level potential is supplied to the wiring d2[1], and the high-level potential is supplied to the wirings d2[2] and d2[3]. Thus, the transistors Trd1[1], Trd2[2], and Trd2[3] are turned on and the transistors Trd1[2], Trd1[3], and Trd2[1] are turned off. In other words, the voltage of a section between the terminal RT2 of the circuit RS[2] and the terminal RT1 of the circuit RS[1] becomes Vrlcd. Note that in this operation example, a voltage drop between the source and the drain of each of the transistors Trd1[1], Trd2[2], and Trd2[3] is ignored to simplify the explanation.

Note that in each of FIGS. 3 to 6, in the RLCD mode, the on/off state of each of the switches SWd1[1] to SWd1[n−1] and the switches SWd2[1] to SWd2[n−1] is determined in accordance with the threshold value. When the threshold value is the LSB, the switches SWd1[1] to SWd1[n−1] are off, and the switches SWd2[1] to SWd2[n−1] are on. When the threshold value is the low-order f-th bit (f is an integer of 2 to n−1), the switches SWd1[1] to SWd1[f−1] and the switches SWd2[1] to SWd2[n−1] are on, and the switches SWd2[1] to SWd2[f−1] and the switches SWd1[f] to SWd1[n−1] are off. When the threshold value is the low-order n-th bit, the switches SWd1[1] to SWd1[n−1] are on, and the switches SWd2[1] to SWd2[n−1] are off. In view of the above, in the circuit configuration of FIG. 7 and in this operation example, the transistors Trd1[1], Trd2[2], and Trd2[3] are on and the transistors Trd2[1], Trd1[2], and Trd1[3] are off in the RLCD mode because the threshold value is the second LSB.

From the time T6 to the time T7, potentials corresponding bits of the digital video data "0001" are supplied to the respective wirings e[1] to e[4]. Specifically, when the q-th digit is "1," the high-level potential is supplied to the wiring e[q]; whereas when the q-th digit is "0," the low-level potential is supplied to the wiring e[q]. That is, the low-level potential is supplied to the wirings e[2] to e[4], whereas the high-level potential is supplied to the wiring e[1].

Consequently, in the input terminal group ITS of the pass transistor logic circuit PTL, only the terminal electrically connected to the terminal PT[1]_2 of the circuit RS[1] establishes electrical continuity with the output terminal OUT of the pass transistor logic circuit PTL. That is, the potential of the terminal PT[1]_2 of the circuit RS[1] is output from the output terminal OUT of the pass transistor logic circuit PTL and input to the non-inverting input terminal of the operational amplifier OP3.

Here, the potential of the terminal PT[1]_2 of the circuit RS[1] is considered. At the time T6, the transistor Trd1[2] and the transistor Trd1[3] are off, so that the resistor string in the digital-to-analog converter circuit 250A is configured with the circuit RS[1] and the circuit RS[2]. Thus, the number of resistors between the terminal RT1 of the circuit RS[1] and the terminal RT2 of the circuit RS[2] is four, and the total resistance of the resistor string is 4R. In the resistor string composed of the circuits RS[1] and RS[2], the terminal PT[1]_2 is placed following the first resistor among the four resistors from the wiring GNDL side. That is, the total resistance from the terminal RT1 of the circuit RS[1] to the terminal PT[1]_2 of the circuit RS[1] is 4 R. Accordingly, the potential of the terminal PT[1]_2 is (R/4R)× Vrlcd=Vrlcd/4.

From the time T7 to the time T8, the high-level potential is supplied to the wiring OLL. Thus, the transistor OLTr is turned on, and electrical continuity is established between the output terminal of the operational amplifier OP3 and the first terminal of the switch BSW. As a result, the potential Vrlcd/4 is output from the terminal LT.

In the above explanation, the value of digital video data is "1001," and the threshold value is the second LSB. Next, the description is made on a potential output from the terminal LT when digital video data has a given value and its threshold value is the second LSB. In this case also, all bits of the digital video data higher than the threshold value are "0"; hence, the low-level potential is supplied to the wiring e[3] and the wiring e[4], which correspond to the high-order 2 bits. The low-order 2 bits (the value of the first and second digits) are any of four values of "00" to "11"; thus, potentials corresponding to the values of the respective bits are input to the wirings e[1] and e[2] (specifically, as described above, the high-level potential is supplied to the wiring e[q] when the q-th digit is "1," whereas the low-level potential is supplied to the wiring e[q] when the q-th digit is "0"). In other words, when the threshold value is set to the second LSB, the power supply potential Vrlcd can be equally divided into four levels, and a potential output from the terminal LT is determined as one of the four levels in accordance with the value of the low-order 2 bits. Specifically, the GND potential, Vrlcd/4, Vrlcd/2, and Vrlcd×3/4 are output from the terminal OT in accordance with the respective values "00" to "11" of the high-order 2 bits.

Next, the description is made on the case where digital video data has a given value and its threshold value is the LSB. When the threshold value is the LSB, the LSB (the value of the first digit) of the digital video data contributes to the reflection intensity of the display panel LP. That is, the LSB is either "0" or "1"; thus, a potential corresponding to the value of the bit is input to the wiring e[1]. Meanwhile, bits higher than the threshold value are all "0"; hence, the low-level potential is input to the wiring e[2], the wiring e[3], and the wiring e[4], which correspond to the high-order 3 bits. Note that in the RLCD mode, the on/off state of each of the transistors Trd1[1] to Trd1[3] and the transistors Trd2[1] to Trd2[3] is determined in accordance with the threshold value, and in this case, the transistors Trd1[1] to Trd1[3] are off and the transistors Trd2[1] to Trd2[3] are on. Consequently, the voltage of a section between the terminal RT2 of the circuit RS[1] and the terminal RT1 of the circuit RS[1] becomes Vrlcd. Accordingly, when the threshold value is set to the LSB, the power supply potential Vrlcd can be equally divided into two levels, and a potential output from the terminal OT is determined as one of the two levels in accordance with the value of the LSB. Specifically, the GND potential and Vrlcd/2 are output from the terminal OT in accordance with the respective values "0" and "1" of the LSB.

Next, the description is made on the case where digital video data has a given value and its threshold value is the third LSB. When the threshold value is the third LSB, the low-order 3 bits (the value of the first, second, and third digits) of the digital video data contribute to the reflection intensity of the display panel LP. That is, the low-order 3 bits are any of "000" to "111"; thus, potentials corresponding to the values of the respective bits are input to the wirings e[1], e[2], and e[3]. Meanwhile, bits higher than the threshold value are all "0"; hence, the low-level potential is input to the wiring e[4], which corresponds to the MSB. Note that in the RLCD mode, the on/off state of each of the transistors Trd1[1] to Trd1[3] and the transistors Trd2[1] to Trd2[3] is determined in accordance with the threshold value, and in this case, the transistors Trd1[1], Trd1[2], and Trd2[3] are on and the transistors Trd2[1], Trd2[2], and Trd1[3] are off. Consequently, the voltage of a section between the terminal RT2 of the circuit RS[3] and the terminal RT1 of the circuit RS[1] becomes Vrlcd. Accordingly, when the threshold value is set to the third LSB, the power supply potential Vrlcd can be equally divided into eight levels, and a potential output from the terminal OT is determined as one of the eight levels in accordance with the value of the low-order 3 bits. Specifically, the GND potential, Vrlcd/8, Vrlcd/4, Vrlcd×3/8, Vrlcd/2, Vrlcd×5/8, Vrlcd×3/4, and Vrlcd×7/8 are output from the terminal OT in accordance with the respective values "000" and "111" of the low-order 3 bits.

Performing the operations from the time T5 to the time T8 in the above manner enables a grayscale signal corresponding to an ambient light environment to be transmitted to the display panel LP.

From the time T8 to the time T9, the low-level potential is supplied to the wiring OLL, the wiring SOL, the wiring SLL, the wiring SWL, and the wirings e[1] to e[4], and the high-level potential is supplied to the wirings d1[1] to d1[3] and the wirings d2[1] to d2[3]. That is, the potentials of the above wirings are set the same as those supplied from the time T0 to the time T1, whereby initialization can be performed again.

When the grayscale signal is supplied to a pixel included in the display panel LP, a channel formation region of a selection transistor in the pixel preferably contains an oxide that contains at least one of indium, the element M (any of aluminum, gallium, yttrium, and tin), and zinc. That is, the selection transistor is preferably an OS transistor. The use of an OS transistor enables the off-state current of the selection transistor to be extremely low; thus, grayscale information written to the pixel can be retained for a long time. In other words, the number of rewrite operations of grayscale information to pixels in the display panel LP by the digital-to-analog converter circuit 250A can be reduced in the RLCD mode.

As in the explanation of the OEL mode, a grayscale signal written to the pixel can be retained for a long time; hence, before the next rewrite operation of a grayscale signal to the display panel LP, a grayscale signal for the display panel OP can be rewritten. Thus, both the display panel OP and the display panel LP can concurrently display an image with grayscale corresponding to the ambient light environment.

<Grayscale Adjustment for Display Device>

Next, the description will be made on an example of operation for measuring external light illuminance and adjusting grayscale for a display device.

Figure 9:
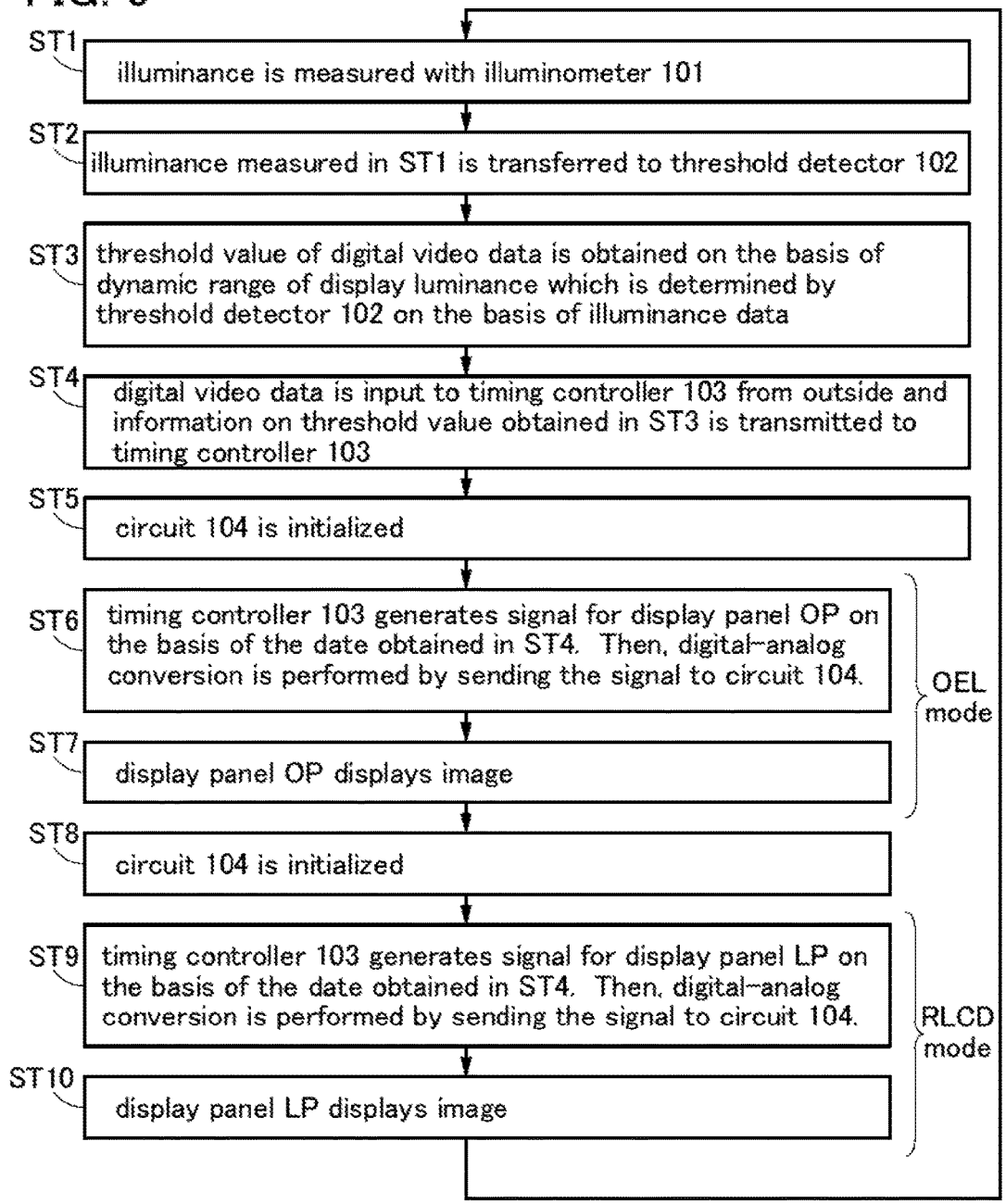
FIG. 9 is a flow chart showing an operation example of a system using a semiconductor device.

FIG. 9 is a flow chart of an operation example of the semiconductor device 100 and the display portion 110 illustrated in FIG. 1. The operation example includes steps ST1 to ST10; grayscale represented by the display device is adjusted with operations in the steps ST1 to ST10.

<<Step ST1>>

In the step ST1, the illuminance of external light is measured with the illuminometer 101. For example, when a photodetector using a photodiode is used as the illuminometer 101, the illuminance can be estimated by measuring the amount of generated current.

<<Step ST2>>

In the step ST2, the illuminance measured in the step ST1 is transferred to the threshold detector 102. At this time, the illuminance is transferred as analog data or digital data.

<<Step ST3>>

In the step ST3, the dynamic range of display luminance at the time when the display portion 110 displays an image is obtained. The dynamic range is determined by the threshold detector 102 on the basis of the illuminance data, which is transferred in the step ST2. Moreover, in the step ST3, the threshold value of digital video data is obtained on the basis of the dynamic range, thereby determining the high-order bit length, which contributes to the emission intensity of the display panel OP, and the low-order bit length, which contributes to the reflection intensity of the display panel LP.

<<Step ST4>>

In the step ST4, digital video data is input to the timing controller 103 from the outside. Moreover, information on the threshold value obtained in the step ST3 is transmitted to the timing controller 103.

<<Step ST5>>

In the step ST5, the circuit 104 is initialized. Specifically, the operation from the time T0 to the time T1 in the timing chart of FIG. 8 is performed in the plurality of digital-to-analog converter circuits 200 included in the circuit 104.

<<Step ST6>>

In the step ST6 and the step ST7, a process for transmitting a grayscale signal to the display panel OP is executed. In the step ST6, the timing controller 103 generates a signal for the display panel OP to be input to the circuit 104, on the basis of the threshold value transferred in the step ST4 and the digital video data. Then, the circuit 104 converts the signal into an analog value to be input to the display panel OP. The analog value obtained by conversion is output to the terminal OT as the grayscale signal. Specifically, the operations from the time T2 to the time T4 in the timing chart of FIG. 8 are performed.

<<Step ST7>>

In the step ST7, the grayscale signal generated in the step ST6 is transmitted to the display panel OP and held in pixels in the display panel OP. Then, the display panel OP displays an image on the basis of the grayscale signal held in each pixel.

<<Sep ST8>>

In the step ST8, the circuit 104 is initialized as in the step ST5. Specifically, the operation from the time T4 to the time T5 in the timing chart of FIG. 8 is performed in the plurality of digital-to-analog converter circuits 200 included in the circuit 104.

<<Step ST9>>

In the step ST9 and the step ST10, a process for transmitting a grayscale signal to the display panel LP is executed. In the step ST9, the timing controller 103 generates a signal for the display panel LP to be input to the circuit 104, on the basis of the threshold value transferred in the step ST4 and the digital video data. Then, the circuit 104 converts the signal into an analog value to be input to the display panel LP. The analog value obtained by conversion is output to the terminal LT as the grayscale signal. Specifically, the operations from the time T5 to the time T8 in the timing chart of FIG. 8 are performed.

<<Step ST10>>

In the step ST10, the grayscale signal generated in the step ST9 is transmitted to the display panel LP and held in pixels in the display panel LP. Then, the display panel LP displays an image on the basis of the grayscale signal held in each pixel.

After the step ST10, the operation returns to the step ST1; the illuminance is measured again with the illuminometer, and images to be displayed on the display panel OP and the display panel LP and their grayscale are updated.

The operation method of one embodiment of the present invention is not limited to the above-described steps ST1 to ST10. In this specification and the like, processes shown in a flow chart are classified according to functions and shown as independent steps. However, in an actual process and the like, it is sometimes difficult to classify processes shown in a flow chart functionally, and there is a case where a plurality of steps are associated with one step or a case where one step is associated with a plurality of steps. Thus, processes shown in a flow chart are not limited to steps described in the specification and can be replaced as appropriate depending on circumstances. Specifically, depending on circumstances or conditions or as needed, the order of steps can be changed or a step can be added or omitted, for example.

For example, the order of transmitting grayscale signals to the display panel OP and the display panel LP is not limited to that shown in the flow chart of FIG. 9; hence, the step ST6 and the step ST7 may be interchanged with the step ST9 and the step ST10.

Note that this embodiment can be combined with any of the other embodiments in this specification as appropriate.

Embodiment 2

This embodiment will show an example where the semiconductor device described in Embodiment 1 is used in a source driver circuit.

<Source Driver Circuit>

Figure 10:
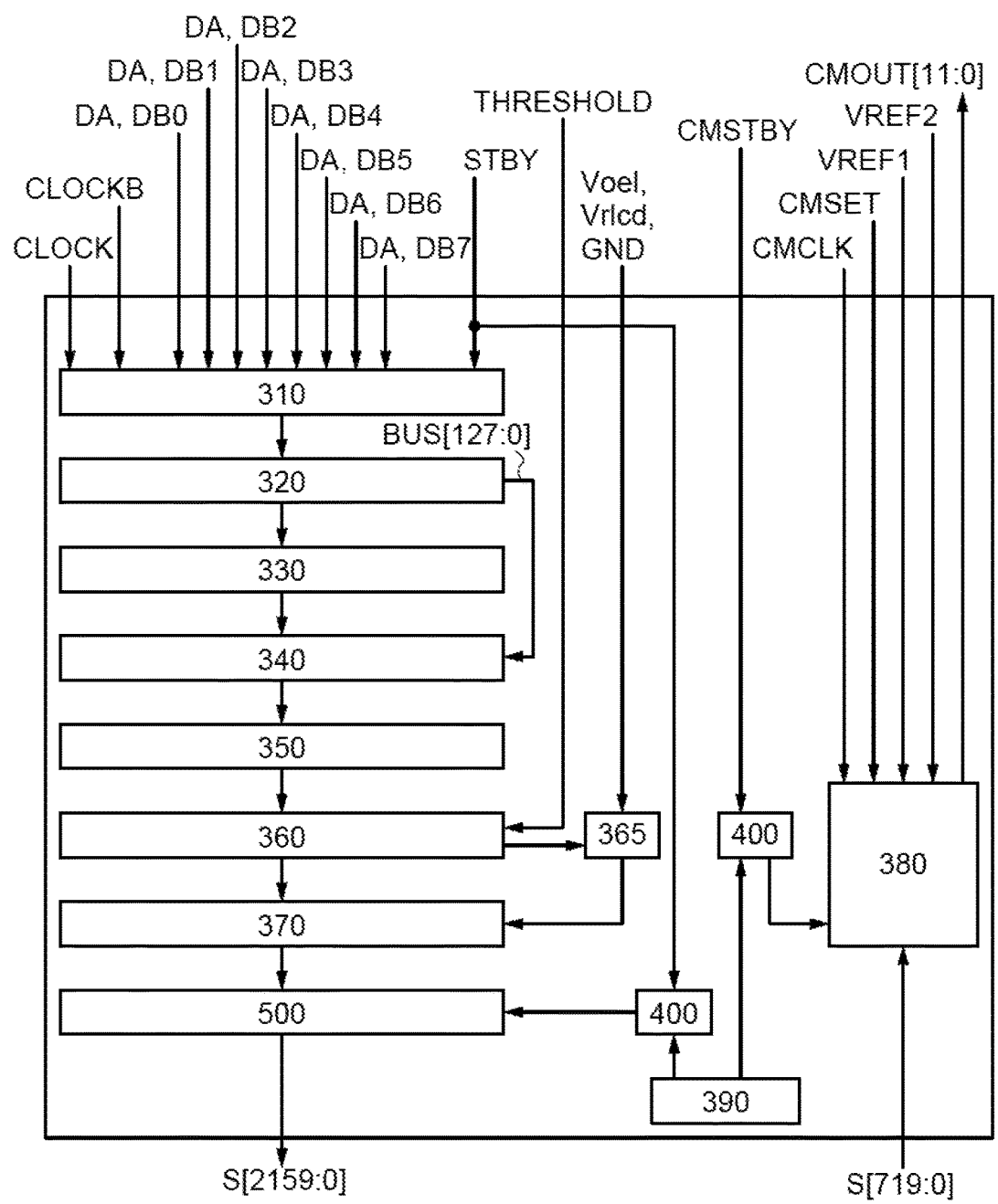
FIG. 10 is a block diagram illustrating an example of a source driver circuit.

FIG. 10 illustrates an example of a source driver circuit of one embodiment of the present invention. A source driver circuit 300 includes a low voltage differential signaling (LVDS) receiver 310, a serial-parallel converter circuit 320, a shift register circuit 330, a latch circuit 340, a level shifter 350, a circuit 360, a resistor string circuit 365, a pass transistor logic circuit 370, an external correction circuit 380, a band gap reference (BGR) circuit 390, a bias generator 400, and a buffer amplifier 500. Note that the number of bias generators 400 included in the source driver circuit 300 in FIG. 10 is two.

The LVDS receiver 310 is electrically connected to an external host processor. The LVDS receiver 310 has a function of receiving video signals from the host processor. Moreover, the LVDS receiver 310 converts a differential signal into a single-ended signal and sends the signal to the serial-parallel converter circuit 320. In FIG. 10, an analog voltage signal DA,DB0, an analog voltage signal DA,DB1, an analog voltage signal DA,DB2, an analog voltage signal DA,DB3, an analog voltage signal DA,DB4, an analog voltage signal DA,DB5, an analog voltage signal DA,DB6, and an analog voltage signal DA,DB7 are input as video signals to the LVDS receiver 310. The LVDS receiver 310 operates sequentially in response to the input of a clock signal CLOCK and a clock signal CLOCKB and can enter a standby state (can be temporarily stopped) in response to a standby signal STBY. Note that the clock signal CLOCKB is an inverted signal of the clock signal CLOCK.

The serial-parallel converter circuit 320 is electrically connected to the LVDS receiver 310. The serial-parallel converter circuit 320 has a function of receiving a single-ended signal from the LVDS receiver 310. Moreover, the serial-parallel converter circuit 320 converts the single-ended signal into parallel signals and transmits the signals as signals BUS[127:0] to internal buses.

The shift register circuit 330 is electrically connected to the serial-parallel converter circuit 320, and the latch circuit 340 is electrically connected to the shift register circuit 330. The shift register circuit 330 has a function of designating the timing at which data in the internal bus is stored in the latch circuit 340 in each line, in synchronization with the serial-parallel converter circuit 320.

The level shifter 350 is electrically connected to the latch circuit 340. The level shifter 350 has a function of shifting the levels of pieces of data in all the lines when the pieces of data in all the lines are stored in the latch circuit 340.

The circuit 360 is electrically connected to the level shifter 350 and the resistor string circuit 365. The circuit 360 receives information on the threshold value (shown as "THRESHOLD" in FIG. 10) that is calculated with the illuminometer and the threshold detector described in Embodiment 1, and generates a signal input to the pass transistor logic circuit 370 (described later in detail) on the basis of the information on the threshold value and video data. Similarly, the circuit 360 generates a signal input to the resistor string circuit 365 on the basis of the information on the threshold value.

The timing controller 103 described in Embodiment 1 is configured with the LVDS receiver 310, the serial-parallel converter circuit 320, the shift register circuit 330, the latch circuit 340, and the circuit 360. The place where the circuit 360 is provided is not limited to the source driver circuit 300 in FIG. 10. For example, the serial-parallel converter circuit 320 may be configured to have a function of the circuit 360 and output a signal based on the information on the threshold value and video data.

The resistor string circuit 365 is electrically connected to the pass transistor logic circuit 370. To the resistor string circuit 365, Voel (the power supply potential for the display panel OP), Vrlcd (the power supply potential for the display panel LP), and the ground potential GND are input. The internal connection structure of the resistor string circuit 365 is determined by a signal input from the circuit 360 described above.

The pass transistor logic circuit 370 is electrically connected to the circuit 360 and the resistor string circuit 365. The digital-to-analog converter circuit 250 described in Embodiment 1 is configured with the pass transistor logic circuit 370, the resistor string circuit 365, and the buffer amplifier 500 (described later in detail). A digital signal input to the pass transistor logic circuit 370 from the circuit 360 is converted into an analog signal, and the analog signal is input to the buffer amplifier 500. Power necessary for digital-to-analog conversion is supplied through the resistor string circuit 365.

The buffer amplifier 500 is electrically connected to the pass transistor logic circuit 370. The buffer amplifier 500 has a function of amplifying the data subjected to digital-to-analog conversion and sending the amplified data (denoted by S[2159:0] in FIG. 10) as data signals to a pixel array.

The BGR circuit 390 has a function of generating a voltage serving as a reference for driving the source driver circuit 300. The BGR circuit 390 is electrically connected to the two bias generators 400.

One of the bias generators 400 is electrically connected to the BGR circuit 390 and the buffer amplifier 500. The one bias generator 400 has a function of generating a bias voltage for driving the buffer amplifier 500 on the basis of the voltage serving as a reference that is generated in the BGR circuit 390. Note that the standby signal STBY is input to the one bias generator 400 at the same timing as the input of the standby signal STBY to the LVDS receiver 310 to cause the one bias generator 400 to enter a standby state (to stop temporarily).

The other of the bias generators 400 is electrically connected to the external correction circuit 380. The other bias generator 400 has a function of generating a bias voltage for driving the external correction circuit 380 on the basis of the voltage serving as a reference that is generated in the BGR circuit 390. Note that when the external correction circuit 380 does not need to operate, a standby signal CMSTBY is transmitted to the other bias generator 400 to cause the other bias generator 400 to enter a standby state (to stop temporarily).

The external correction circuit 380 is electrically connected to transistors included in pixel circuits. If pixel transistors in the pixel array have variations in voltage-current characteristics, the variations influence an image displayed on the display device, causing reduction in the display quality of the display device. The external correction circuit 380 has a function of measuring the amount of current flowing thought the pixel transistor and adjusting the amount of the current flowing through the pixel transistor as appropriate depending on the measured current amount. The external correction circuit 380 is initialized with input of a set signal CMSET. The external correction circuit 380 operates with input of a clock signal CMCLK. The external correction circuit 380 is supplied with signals (denoted by S[719:0] in FIG. 10) from the transistors included in the pixel circuits, and makes determination related to image correction with a reference potential VREF1 and a reference potential VREF2 that are supplied to the external correction circuit 380, used as references. A result of the determination related to correction is transmitted as output signals CMOUT[11:0] to an image processor provided outside the source driver circuit 300. The image processor corrects video data on the basis of the contents of CMOUT[11:0].

Note that one embodiment of the present invention is not limited to the source driver circuit 300 shown in FIG. 10 and does not necessarily include the external correction circuit 380. For example, instead of the external correction circuit 380, a correction circuit may be provided in each pixel included in the pixel array.

Note that this embodiment can be combined with any of the other embodiments in this specification as appropriate.

Embodiment 3

Referring to FIGS. 11A to 11E, this embodiment will show an example where the semiconductor device described in the foregoing embodiment is used in an electronic component.

<Electronic Component>

Figure 11C:
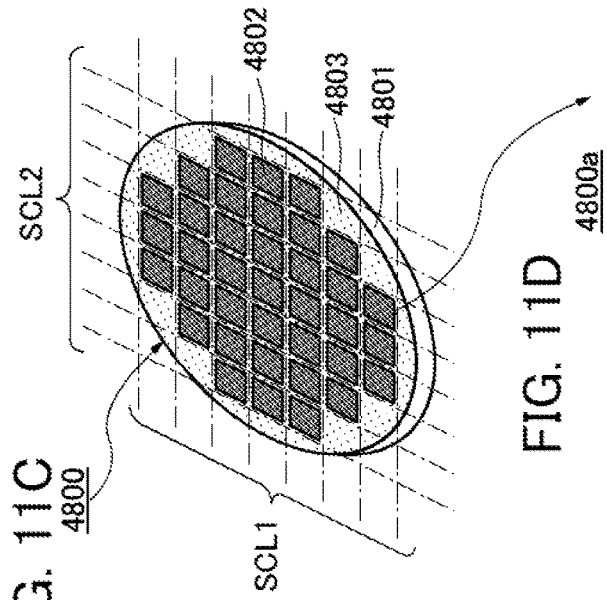
FIGS. 11C to 11E are perspective views of semiconductor wafers.
Figure 11D:
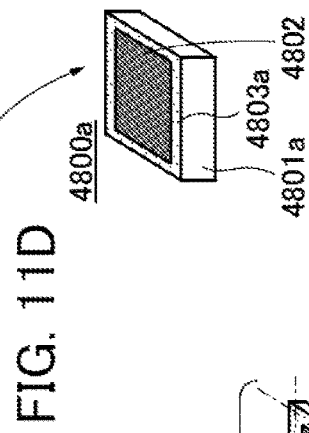
Figure 11B:
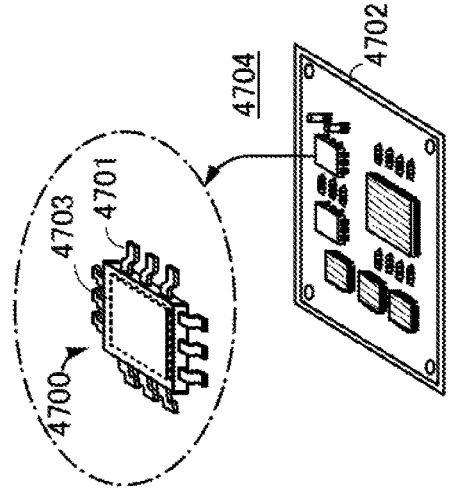
FIG. 11B is a perspective view of the electronic component.
Figure 11E:
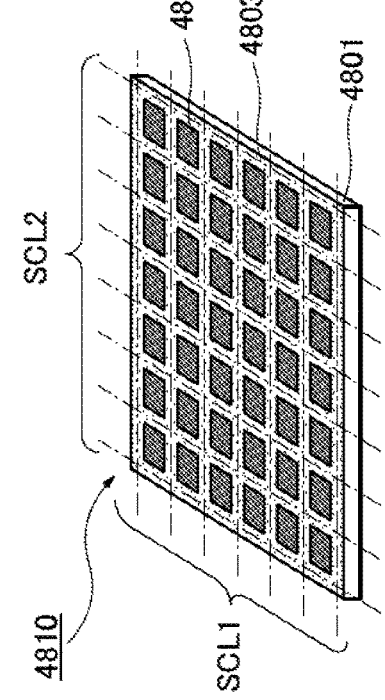
Figure 11A:
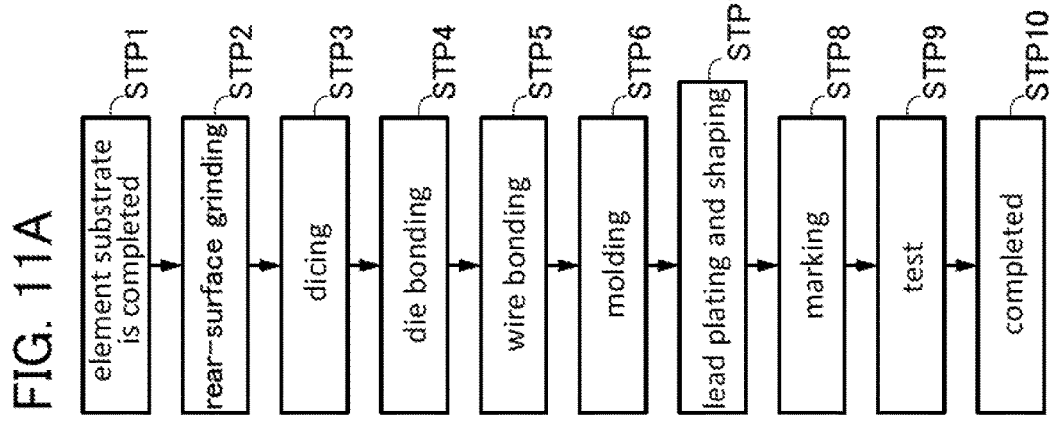
FIG. 11A is a flow chart showing an example of a method for manufacturing an electronic component.

FIG. 11A shows an example in which the semiconductor device described in the foregoing embodiment is used as a memory device in an electronic component. Note that an electronic component is also referred to as a semiconductor package or an IC package. For the electronic component, there are various standards and names corresponding to the direction or the shape of terminals; hence, one example of the electronic component will be described in this embodiment.

The semiconductor device including transistors, capacitors, and the like, such as one described in Embodiment 1, is completed through an assembly process (post-process) of assembling detachable components on a printed board.

The post-process can be completed through steps shown in FIG. 11A. Specifically, after an element substrate obtained in a wafer process is completed (Step STP1), a rear surface of the substrate is ground (Step STP2). The substrate is thinned in this step to reduce warpage or the like of the substrate caused in the wafer process and to reduce the size of the component itself After the rear surface of the substrate is ground, a dicing step is performed to divide the substrate into a plurality of chips (Step STP3). Then, the divided chips are separately picked up to be mounted on and bonded to a lead frame in a die bonding process (Step STP4). In this die bonding process, the chip is bonded to the lead frame by an appropriate method depending on a product, for example, bonding with a resin or a tape. Note that in the die bonding process, the chip may be mounted on and bonded to an interposer.

Note that in this embodiment, when an element is formed on one surface of a substrate, the other surface (a surface on which the element is not formed) is referred to as a rear surface.

Next, wiring bonding for electrically connecting a lead of the lead frame and an electrode on a chip through a metal fine line (wire) is performed (Step STP5). A silver line or a gold line can be used as the metal fine line. Ball bonding or wedge bonding can be used as the wire bonding.

A wire-bonded chip is subjected to a molding step of sealing the chip with an epoxy resin or the like (Step STP6). With the molding step, the inside of the electronic component is filled with a resin, thereby reducing damage to the circuit portion and the wire embedded in the component caused by external mechanical force as well as reducing deterioration of characteristics due to moisture or dust.

Next, plate processing is performed on the lead of the lead frame. Then, the lead is cut and processed into a predetermined shape (Step STP7). This plate processing prevents rust of the lead and enables more reliable soldering at the time of mounting the electronic component on a printed board in a later step.

Next, printing (marking) is performed on a surface of the package (Step STP8). After a final testing step (Step STP9), the electronic component is completed (Step STP 10).

Since the above electronic component can include the semiconductor device described in the foregoing embodiment, it is possible to obtain a highly reliable electronic component.

FIG. 11B is a schematic perspective view of the completed electronic component. FIG. 11B shows a perspective schematic view of a quad flat package (QFP) as an example of the electronic component. An electronic component 4700 in FIG. 11B includes a lead 4701 and a circuit portion 4703. The electronic component 4700 in FIG. 11B is mounted on a printed board 4702, for example. A plurality of electronic components 4700 that are combined and electrically connected to each other over the printed board 4702 can be equipped in an electronic device. A completed circuit board 4704 is provided in an electronic device or the like.

Note that an electronic component in one embodiment of the present invention is not limited to the electronic component 4700 and may be the element substrate fabricated in Step STP1. In addition, the element substrate of one embodiment of the present invention includes an element substrate that has been subjected to Step STP2 where the rear surface of the substrate is ground. Furthermore, the element substrate of one embodiment of the present invention includes an element substrate that has been subjected to Step STP3 where the dicing step is performed. For example, a semiconductor wafer 4800 shown in FIG. 11C corresponds to such an element substrate. In the semiconductor wafer 4800, a plurality of circuit portions 4802 are formed on a top surface of a wafer 4801. A portion without the circuit portions 4802 on the top surface of the wafer 4801 is a spacing 4803 that is a region for dicing.

The dicing is carried out along scribe lines SCL1 and scribe lines SCL2 (referred to as dicing line or cutting line in some cases) indicated by dashed-dotted lines. To perform the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 intersect each other perpendicularly.

With the dicing step, a chip 4800a shown in FIG. 11D can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the length of margin for cutting the scribe line SCL1 or the scribe line SCL2.

The shape of the element substrate of one embodiment of the present invention is not limited to the shape of the semiconductor wafer 4800 shown in FIG. 11C. For example, a rectangular semiconductor wafer 4810 shown in FIG. 11E can be employed. The shape of the element substrate can be changed as appropriate, depending on a process for fabricating an element and an apparatus for fabricating an element.

Note that this embodiment can be combined with any of the other embodiments in this specification as appropriate.

Embodiment 4

This embodiment will show an electronic device including the semiconductor device described in Embodiment 1.

Figure 12:
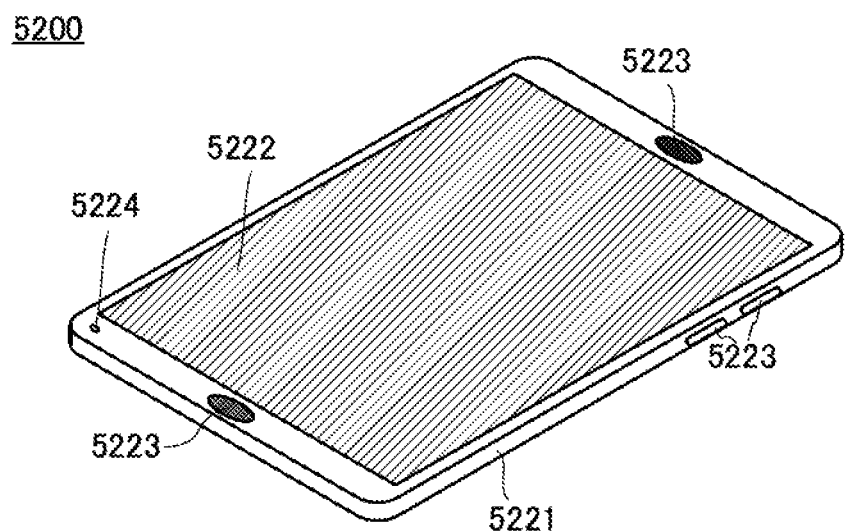
FIG. 12 is a perspective view illustrating an example of an electronic device.

FIG. 12 illustrates a tablet information terminal 5200 that includes a housing 5221, a display portion 5222, operation buttons 5223, and a speaker 5224. A display device with a position input function may be used for the display portion 5222. Note that the position input function can be added by providing a touch panel in a display device. Alternatively, the position input function can be added by providing a photoelectric conversion element called a photosensor in a pixel area of a display device. As the operation buttons 5223, any one of a power switch for starting the information terminal 5200, a button for operating an application of the information terminal 5200, a volume control button, a switch for turning on or off the display portion 5222, and the like can be provided. Although the number of the operation buttons 5223 is four in the information terminal 5200 illustrated in FIG. 12, the number and position of operation buttons included in the information terminal 5200 is not limited to this example.

Although not illustrated, the information terminal 5200 in FIG. 12 may include a microphone, in which case the information terminal 5200 can have a telephone function like a mobile phone, for example.

Although not illustrated, the information terminal 5200 in FIG. 12 may include a camera. Although not illustrated, the information terminal 5200 in FIG. 12 may include a light-emitting device for use as a flashlight or a lighting device.

Although not illustrated, the information terminal 5200 in FIG. 12 may include a sensor (that measures force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, smell, infrared rays, or the like) inside the housing 5221. In particular, providing a sensing device including a sensor for sensing inclination, such as a gyroscope sensor or an acceleration sensor, can determine the orientation of the information terminal 5200 in FIG. 12 (with respect to the vertical direction) and can automatically change display on the screen of the display portion 5222 in response to the orientation of the information terminal 5200.

Although not illustrated, the information terminal 5200 in FIG. 12 may include a device for obtaining biological information such as fingerprints, veins, iris, voiceprints, or the like, in which case the information terminal 5200 can have a biometric identification function.

Although not illustrated, the information terminal 5200 in FIG. 12 may include a microphone, in which case the information terminal 5200 can have a telephone function. In some cases, the information terminal 5200 can have a speech interpretation function. With the speech interpretation function, the information terminal 5200 can have a function of operating the information terminal 5200 by speech recognition, a function of interpreting a speech or a conversation and creating a summary of the speech or the conversation, and the like. This can be utilized to create meeting minutes or the like, for example.

This embodiment can be combined with any of the other embodiments in this specification as appropriate.

Embodiment 5

This embodiment will show an input/output device that can be provided, for example, in the tablet terminal in FIG. 12 described in Embodiment 4.

Figure 13A:
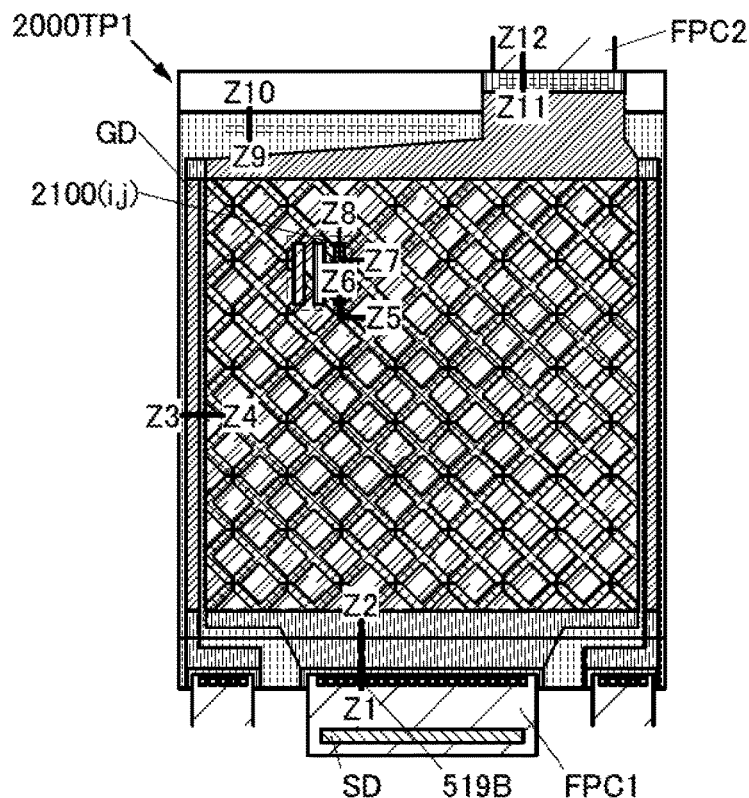
Figures 1, 13B:
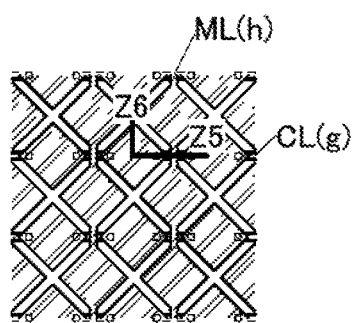
Figures 2, 13B:
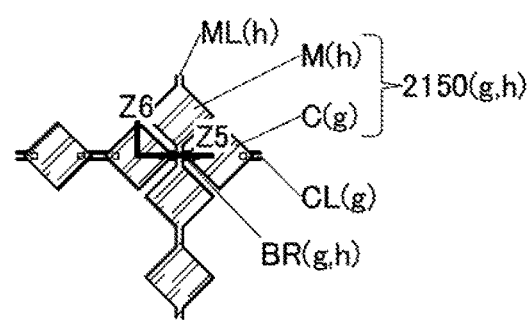
Figure 13C:
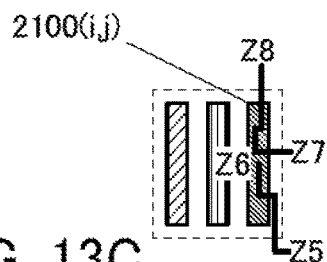

FIGS. 13A, 13B-1, 13B-2, and 13C are diagrams for illustrating the structure of a touch panel 2000TP1 that can be used for an input/output device. FIG. 13A is a top view of the touch panel. FIG. 13B-1 is a schematic view illustrating part of an input portion of the touch panel. FIG. 13B-2 is a schematic view illustrating part of the structure in FIG. 13B-1. FIG. 13C is a schematic view illustrating part of a display portion included in the touch panel.

Figure 14A:
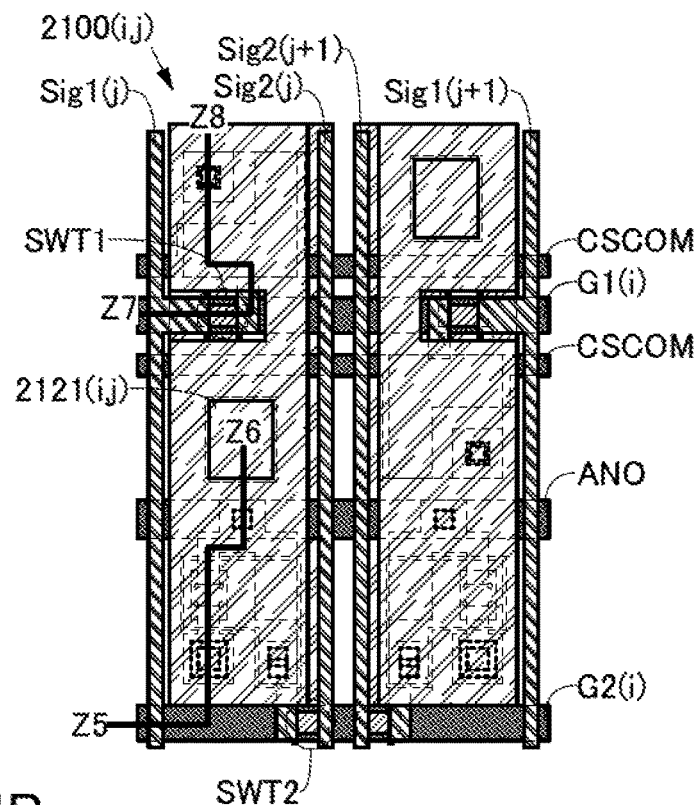
FIGS. 14A and 14B illustrate a structure example of pixels in a display panel of a touch panel.
Figure 14B:
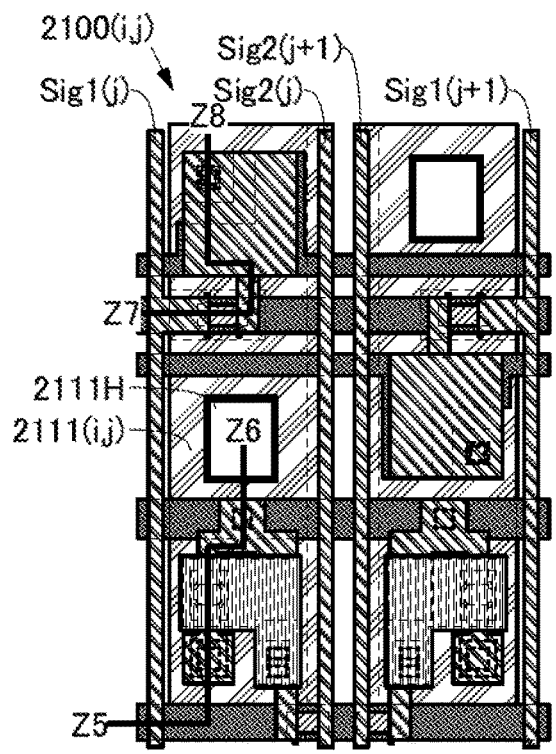

FIG. 14A is a bottom view illustrating part of the structure of a pixel in the touch panel in FIG. 13C. FIG. 14B is a bottom view in which some components in FIG. 14A are omitted.

Figure 15A:
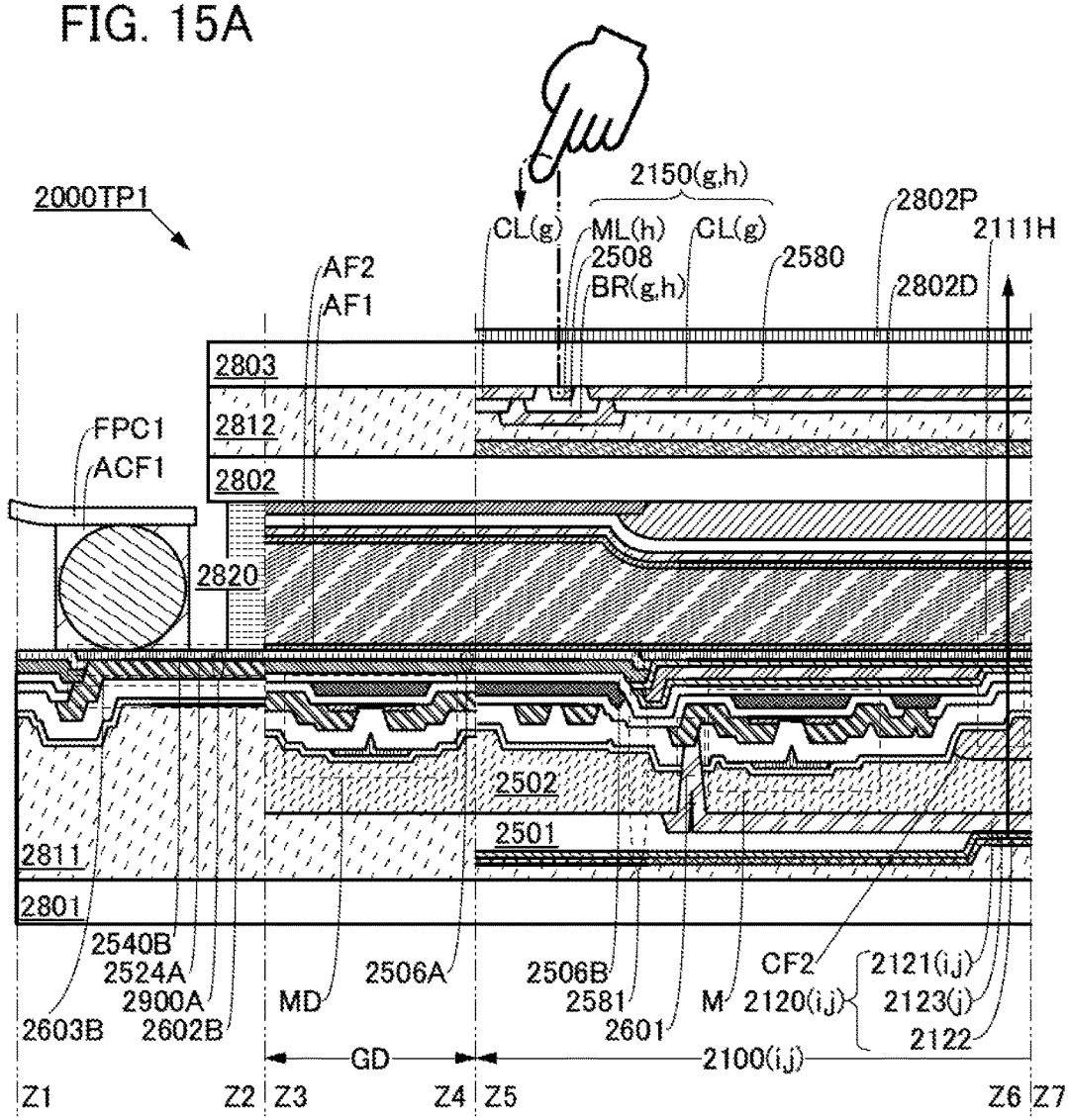
FIGS. 15A and 15B are cross-sectional views illustrating a structure example of a touch panel.
Figure 15B:
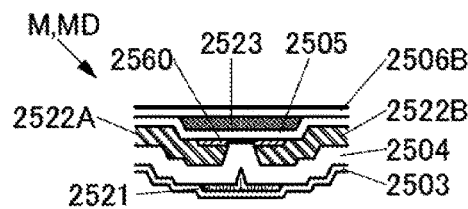

FIGS. 15A and 15B and FIGS. 16A and 16B are cross-sectional views illustrating the structure of the touch panel. FIG. 15A is a cross-sectional view along the bold lines Z1-Z2, Z3-Z4, and Z5-Z6 in FIG. 13A. FIG. 15B illustrates part of FIG. 15A.

Figure 16A:
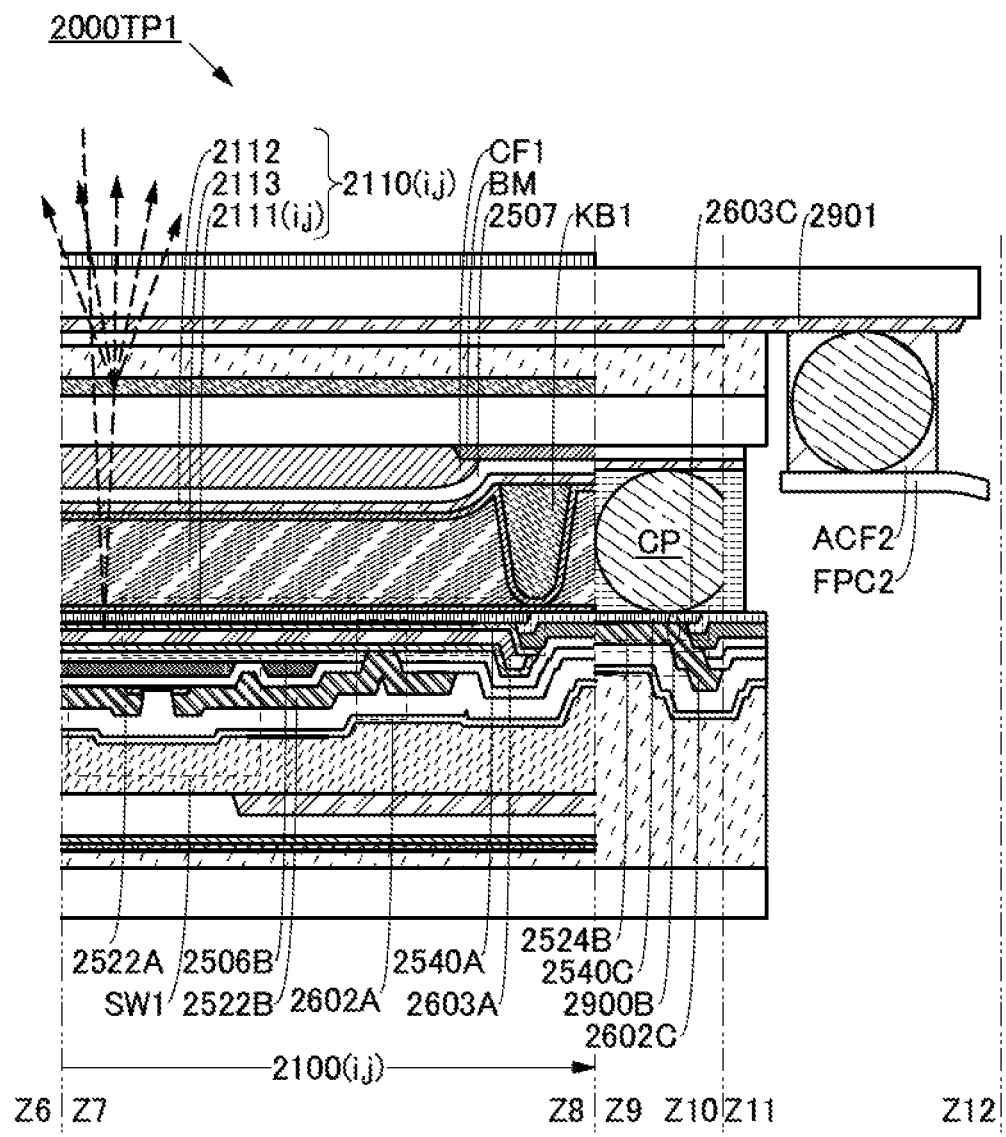
FIGS. 16A and 16B are cross-sectional views illustrating a structure example of a touch panel.
Figure 16B:
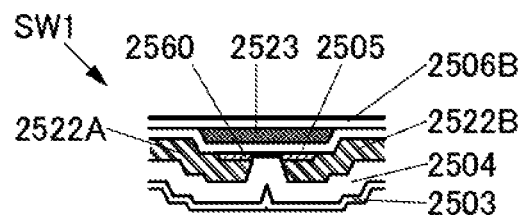

FIG. 16A is a cross-sectional view along the bold lines Z7-Z8, Z9-Z10, and Z11-Z12 in FIG. 13A. FIG. 16B illustrates part of FIG. 16A.

Figure 17A:
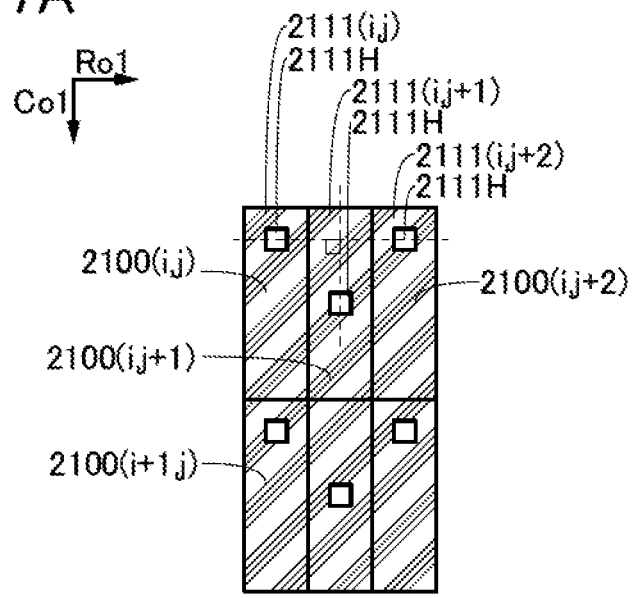
FIGS. 17A to 17C are schematic views each illustrating an example of the shape of a reflective film in a display panel.
Figure 17B:
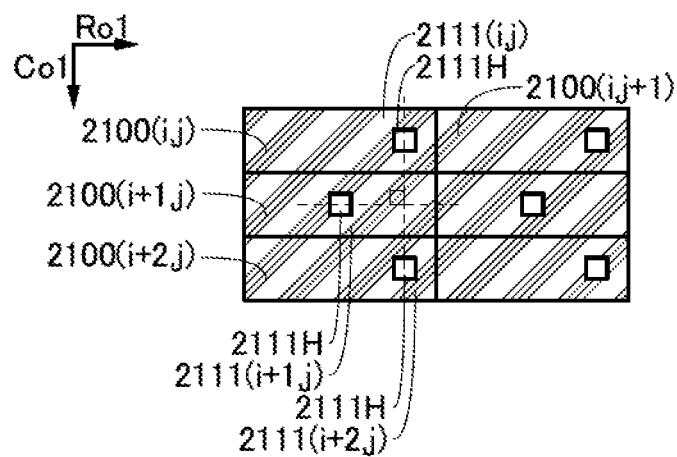
Figure 17C:
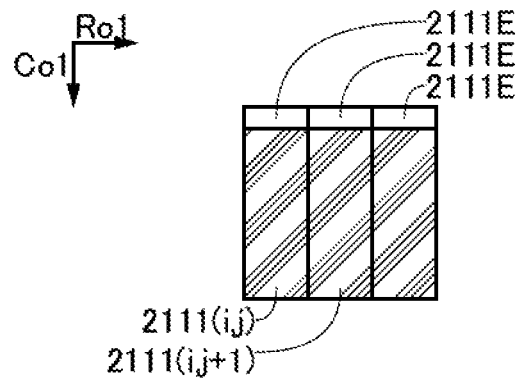

FIGS. 17A to 17C are schematic diagrams each illustrating the shape of a reflective film that can be used for a pixel of the touch panel.

Figure 18:
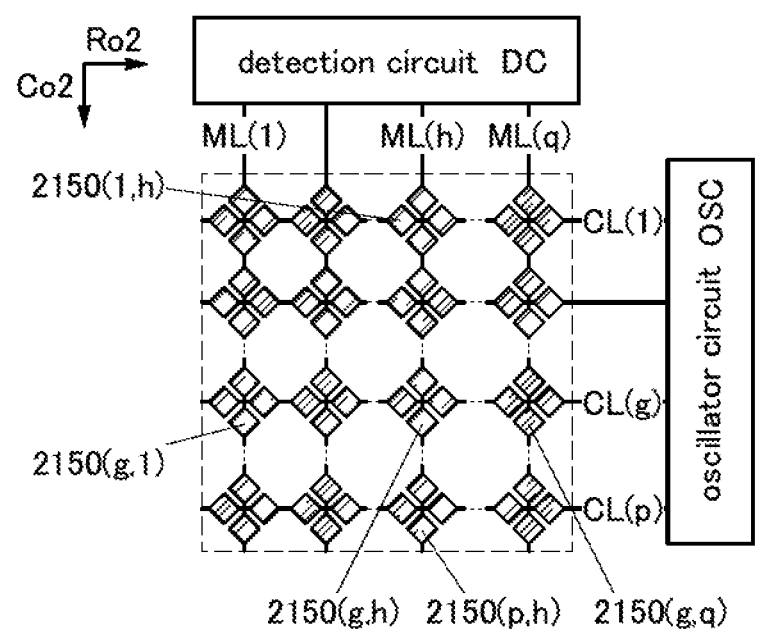
FIG. 18 is a block diagram illustrating a structure example of an input portion.

FIG. 18 is a block diagram illustrating the structure of the input portion of the touch panel.

Figure 19:
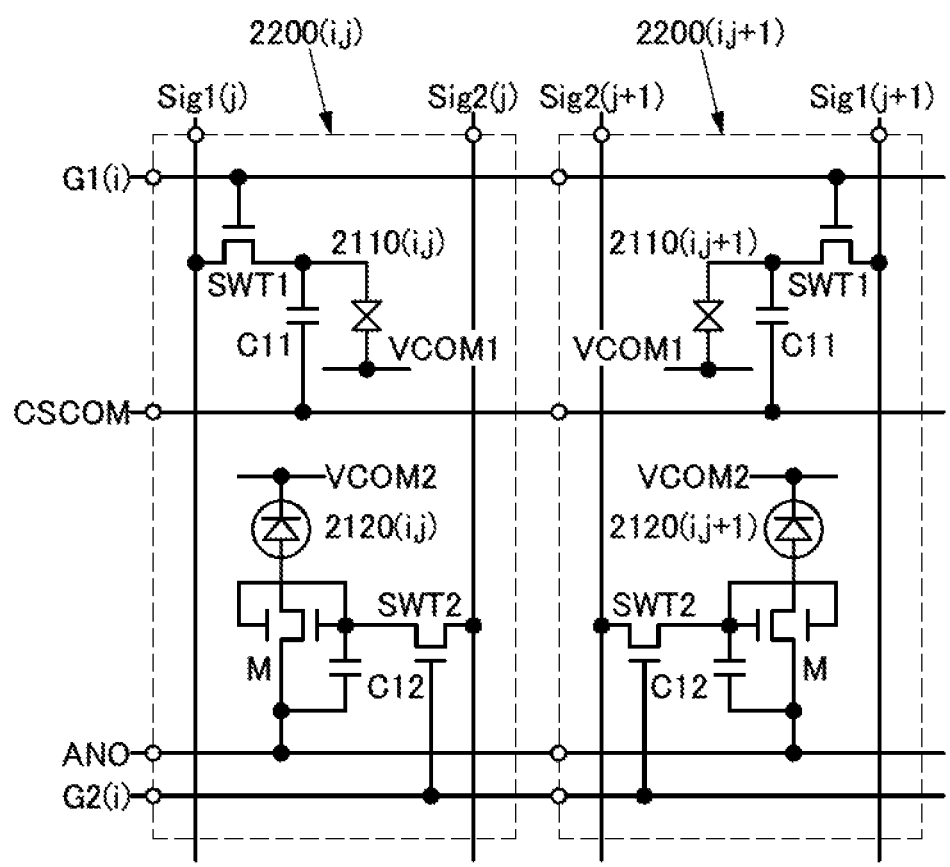
FIG. 19 is a circuit diagram illustrating pixels of a display portion.

FIG. 19 is a circuit diagram illustrating a configuration of a pixel circuit included in the input/output device.

<Structure Example of Input/Output Device>

The input/output device described in this embodiment includes the touch panel 2000TP1 (see FIG. 13A). Note that the touch panel includes the display portion and the input portion.

<<Structure Example of Display Portion>>

The display portion includes a display panel. The display panel includes m×n pixels (a matrix with m rows and n columns). In this embodiment, a pixel in an i-th row (i is an integer of 1 to m) and a j-th column (j is an integer of 1 to n) is referred to as a pixel 2100(i,j).

The pixel 2100(i,j) includes a first conductive film, a second conductive film, a second insulating film 2506B, and a first display element 2110(i,j) (see FIG. 16A).

The second conductive film is electrically connected to a pixel circuit 2200(i,j). For example, a conductive film 2522B that functions as a source electrode or a drain electrode of a transistor used as a switch SWT1 of the pixel circuit 2200(i,j) can be used as the second conductive film (see FIG. 16A and FIG. 19).

The first conductive film includes a region overlapping with the second conductive film. For example, the first conductive film can be used for a first electrode 2111(i,j) of the first display element 2110(i,j).

The second insulating film 2506B includes a region between the first conductive film and the second conductive film. The second insulating film 2506B has an opening 2602A in the region between the first conductive film and the second conductive film. Furthermore, the second insulating film 2506B includes a region between a first insulating film 2506A and a conductive film 2524A. The second insulating film 2506B has an opening 2602B. The second insulating film 2506B also has an opening 2602C (see FIG. 15A and FIG. 16A).

The first conductive film is electrically connected to the second conductive film in the opening 2602A. For example, the first electrode 2111(i,j) is electrically connected to the conductive film 2522B. The first conductive film electrically connected to the second conductive film in the opening 2602A provided in the second insulating film 2506B can be referred to as a through electrode.

The first display element 2110(i,j) is electrically connected to the first conductive film.

The first display element 2110(i,j) includes a reflective film and has a function of controlling the intensity of light reflected by the reflective film. For example, the first conductive film, the first electrode 2111(i,j), or the like can be used as the reflective film of the first display element 2110(i,j). Similarly, the first conductive film, a first electrode 2111(i,j+1), or the like can be used as a reflective film of a first display element 2110(i,j+1), and the first conductive film, a first electrode 2111(i,j+2), or the like can be used as a reflective film of a first display element 2110(i,j+2) (see FIG. 17A). Note that also in FIG. 17B described later, the first electrode 2111(i,j), a first electrode 2111(i+1,j), and a first electrode 2111(i+2,j) are illustrated as the reflective film.

The second display element 2120(i,j) has a function of emitting light toward the second insulating film 2506B (see FIG. 15A).

The reflective film has a shape including a region that does not block light emitted from the second display element 2120(i,j).

The reflective film included in the pixel 2100(i,j) of the display panel described in this embodiment includes one or a plurality of openings 2111H (see FIGS. 17A and 17B).

The second display element 2120(i,j) has a function of emitting light toward the opening 2111H. Note that the opening 2111H transmits light emitted from the second display element 2120(i,j).

The opening 2111H of the pixel 2100(i,j+1), which is adjacent to the pixel 2100(i,j), is not provided on a line that extends in the row direction (the direction indicated by an arrow Ro1 in the drawing) through the opening 2111H of the pixel 2100(i,j) (see FIG. 17A). As another example, the opening 2111H of the pixel 2100(i+1,j), which is adjacent to the pixel 2100(i,j), is not provided on a line that extends in the column direction (the direction indicated by an arrow Co1 in the drawing) through the opening 2111H of the pixel 2100(i,j) (see FIG. 17B).

For example, the opening 2111H of the pixel 2100(i,j+2) is provided on a line that extends in the row direction through the opening 2111H of the pixel 2100(i,j) (see FIG. 17A). In addition, the opening 2111H of the pixel 2100(i,j+1) is provided on a line that is perpendicular to the above-mentioned line between the opening 2111H of the pixel 2100(i,j) and the opening 2111H of the pixel 2100(i,j+2).

Alternatively, for example, the opening 2111H of the pixel 2100(i+2,j) is provided on a line that extends in the column direction through the opening 2111H of the pixel 2100(i,j) (see FIG. 17B). In addition, for example, the opening 2111H of the pixel 2100(i+1,j) is provided on a line that is perpendicular to the above-mentioned line between the opening 2111H of the pixel 2100(i,j) and the opening 2111H of the pixel 2100(i+2,j).

Thus, a third display element that displays a color different from that displayed by the second display element can be provided easily near the second display element. As a result, a display panel with high convenience or high reliability can be provided.

For example, the reflective film can be formed using a material having a shape in which an end portion is cut off so as to form a region 2111E that does not block light emitted from the second display element 2120(i,j) (see FIG. 17C). Specifically, the first electrode 2111(i,j) whose end portion is cut off so as to be shorter in the column direction (the direction indicated by the arrow Co1 in the drawing) can be used as the reflective film. Note that FIG. 17C shows the first electrode 2111(i,j+1) in addition to the first electrode 2111(i,j).

Thus, the first display element and the second display element that displays an image using a method different from that of the first display element can be driven using pixel circuits that can be formed in the same process, for example. Specifically, a reflective display element is used as the first display element, whereby the power consumption can be reduced or an image with high contrast can be favorably displayed in an environment with bright external light. In addition, the second display element that emits light is used, whereby an image can be favorably displayed in a dark environment. Furthermore, using the second insulating film, impurity diffusion between the first display element and the second display element or between the first display element and the pixel circuit can be suppressed. Part of light emitted from the second display element to which a voltage controlled on the basis of control data is supplied is not blocked by the reflective film included in the first display element. As a result, a display device with high convenience or high reliability can be provided.

The second display element 2120(i,j) included in the pixel of the input/output device described in this embodiment is provided so that display using the second display element 2120(i,j) can be seen from part of a region from which display using the first display element 2110(i,j) can be seen. For example, dashed arrows shown in FIG. 16A denote the directions in which external light is incident on and reflected by the first display element 2110(i,j) that performs display by controlling the intensity of external light reflection. In addition, a solid arrow shown in FIG. 15A denotes the direction in which the second display element 2120(i,j) emits light to the part of the region from which display using the first display element 2110(i,j) can be seen.

Accordingly, display using the second display element can be seen from part of the region where display using the first display element can be seen. Alternatively, a user can see the display without changing the position or the like of the display panel. As a result, a display panel with high convenience or high reliability can be provided.

The pixel circuit 2200(i,j) is electrically connected to a signal line Sig1(j). Note that the conductive film 2522A is electrically connected to the signal line Sig1(j) (see FIG. 16A and FIG. 19). Furthermore, for example, the transistor in which the second conductive film is used as the conductive film 2522B serving as the source electrode or the drain electrode can be used as the switch SW1 of the pixel circuit 2200(i,j).

The display panel described in this embodiment includes the first insulating film 2506A (see FIG. 15A).

The first insulating film 2506A has a first opening 2603A, a second opening 2603B, and an opening 2603C (see FIG. 15A or FIG. 16A).

The first opening 2603A includes a region overlapping with a first intermediate film 2540A and the first electrode 2111(i,j) or a region overlapping with the first intermediate film 2540A and the second insulating film 2506B.

The second opening 2603B includes a region overlapping with a second intermediate film 2540B and the conductive film 2524A. The opening 2603C includes a region overlapping with an intermediate film 2540C and a conductive film 2524B.

The first insulating film 2506A includes a region that is along an outer edge of the first opening 2603A and is between the first intermediate film 2540A and the second insulating film 2506B. The first insulating film 2506A also includes a region that is along an outer edge of the second opening 2603B and is between the second intermediate film 2540B and the conductive film 2524A.

The display panel described in this embodiment includes a scan line G2(i), a wiring CSCOM, a third conductive film ANO, and a signal line Sig2(j) (see FIG. 19).

The second display element 2120(i,j) of the display panel described in this embodiment includes a third electrode 2121(i,j), a fourth electrode 2122, and a layer 2123(j) containing a light-emitting material (see FIG. 15A). Note that the third electrode 2121(i,j) and the fourth electrode 2122 are electrically connected to the third conductive film ANO and a fourth conductive film VCOM2, respectively (see FIG. 19).

The fourth electrode 2122 includes a region overlapping with the third electrode 2121(i,j).

The layer 2123(j) containing a light-emitting material includes a region between the third electrode 2121(i,j) and the fourth electrode 2122.

The third electrode 2121(i,j) is electrically connected to the pixel circuit 2200(i,j) at a connection portion 2601.

The first display element 2110(i,j) of the display panel described in this embodiment includes a layer 2113 containing a liquid crystal material, the first electrode 2111(i,j), and a second electrode 2112. The second electrode 2112 is positioned such that an electric field that controls the alignment of the liquid crystal material is generated between the second electrode 2112 and the first electrode 2111(i,j) (see FIG. 15A and FIG. 16A).

The display panel described in this embodiment includes an alignment film AF1 and an alignment film AF2. The alignment film AF2 is provided such that the layer 2113 containing a liquid crystal material is sandwiched between the alignment film AF1 and the alignment film AF2.

The display panel described in this embodiment includes the first intermediate film 2540A and the second intermediate film 2540B.

The first intermediate film 2540A includes a region that overlaps with the second insulating film 2506B with the first conductive film placed therebetween, and the first intermediate film 2540A includes a region in contact with the first electrode 2111(i,j). The second intermediate film 2540B includes a region in contact with the conductive film 2524A.

The display panel described in this embodiment includes a light-blocking film BM, an insulating film 2507, a functional film 2802P, a functional film 2802D, a coloring film CF1, and a coloring film CF2.

The light-blocking film BM has an opening in a region overlapping with the first display element 2110(i,j). The coloring film CF2 is provided between the second insulating film 2506B and the second display element 2120(i,j) and includes a region overlapping with the opening 2111H (see FIG. 15A).

The insulating film 2507 includes a region between the coloring film CF1 and the layer 2113 containing a liquid crystal material or between the light-blocking film BM and the layer 2113 containing a liquid crystal material. Thus, unevenness due to the thickness of the coloring film CF1 can be reduced. Alternatively, impurities can be prevented from being diffused from the light-blocking film BM, the coloring film CF1, or the like to the layer 2113 containing a liquid crystal material.

The functional film 2802P includes a region overlapping with the first display element 2110(i,j).

The functional film 2802D includes a region overlapping with the first display element 2110(i,j). The functional film 2802D is provided such that a substrate 2802 is sandwiched between the functional film 2802D and the first display element 2110(i,j). Thus, light reflected by the first display element 2110(i,j) can be diffused, for example.

The display panel described in this embodiment includes a substrate 2801, the substrate 2802, and a functional layer 2581.

The substrate 2802 includes a region overlapping with the substrate 2801.

The functional layer 2581 includes a region between the substrate 2801 and the substrate 2802. The functional layer 2581 includes the pixel circuit 2200(i,j), the second display element 2120(i,j), an insulating film 2502, and an insulating film 2501. The functional layer 2581 also includes an insulating film 2503 and an insulating film 2504 (see FIGS. 15A and 15B).

The insulating film 2502 includes a region between the pixel circuit 2200(i,j) and the second display element 2120(i,j).

The insulating film 2501 is provided between the insulating film 2502 and the substrate 2801 and has an opening in a region overlapping with the second display element 2120(i,j).

The insulating film 2501 formed along an outer edge of the third electrode 2121(i,j) prevents a short circuit between the third electrode 2121(i,j) and the fourth electrode.

The insulating film 2503 includes a region between the insulating film 2502 and the pixel circuit 2200(i,j). The insulating film 2504 includes a region between the insulating film 2503 and the pixel circuit 2200(i,j).

The display panel described in this embodiment includes a bonding layer 2811, a sealing material 2820, and a structure body KB1.

The bonding layer 2811 includes a region between the functional layer 2581 and the substrate 2801, and has a function of bonding the functional layer 2581 and the substrate 2801 together.

The sealing material 2820 includes a region between the functional layer 2581 and the substrate 2802, and has a function of bonding the functional layer 2581 and the substrate 2802 together.

The structure body KB1 has a function of providing a certain space between the functional layer 2581 and the substrate 2802.

The display panel described in this embodiment includes a terminal 2900A and a terminal 2900B.

The terminal 2900A includes the conductive film 2524A and the second intermediate film 2540B. The second intermediate film 2540B includes a region in contact with the conductive film 2524A. The terminal 2900A is electrically connected to the signal line Sig1(j), for example.

The terminal 2900A can be electrically connected to a flexible printed circuit FPC1 using a conductive material ACF1.

The terminal 2900B includes the conductive film 2524B and the intermediate film 2540C. The intermediate film 2540C includes a region in contact with the conductive film 2524B. The conductive film 2524B is electrically connected to a wiring VCOM1, for example.

A conductive material CP is sandwiched between the terminal 2900B and the second electrode 2112, and has a function of electrically connecting the terminal 2900B and the second electrode 2112. For example, a conductive particle can be used as the conductive material CP.

Moreover, the display panel described in this embodiment includes a driver circuit GD and a driver circuit SD (see FIG. 13A).

The driver circuit GD is electrically connected to a scan line G1(i). The driver circuit GD includes a transistor MD, for example (see FIG. 15A). Specifically, a transistor including a semiconductor film that can be formed in the same process as the transistor included in the pixel circuit 2200(i,j) can be used as the transistor MD.

The driver circuit SD is electrically connected to the signal line Sig1(j). The driver circuit SD is electrically connected to the terminal 2900A, for example.

<<Structure Example of Input Portion>>

The input portion includes a region overlapping with the display panel (see FIGS. 13A, 13B-1, 13B-2, and 13C, FIG. 15A, or FIG. 16A).

The input portion includes a substrate 2803, a functional layer 2582, a bonding layer 2812, and a terminal 2901 (see FIG. 15A and FIG. 16A).

The input portion includes a control line CL(g), a sensing signal line ML(h), and a sensing element 2150(g,h) (see FIG. 13B-2).

The functional layer 2582 includes a region between the substrate 2802 and the substrate 2803. The functional layer 2582 includes the sensing element 2150(g,h) and an insulating film 2508.

The bonding layer 2812 is provided between the functional layer 2582 and the substrate 2802 and has a function of bonding the functional layer 2582 and the substrate 2802 together.

The sensing element 2150(g,h) is electrically connected to the control line CL(g) and the sensing signal line ML(h).

The control line CL(g) has a function of supplying a control signal.

The sensing element 2150(g,h) receives the control signal and has a function of supplying the control signal and a sensing signal that changes in accordance with a distance between the sensing element 2150(g,h) and an object approaching a region overlapping with the display panel.

The sensing signal line ML(h) has a function of receiving the sensing signal.

The sensing element 2150(g,h) has a light-transmitting property.

The sensing element 2150(g,h) includes an electrode C(g) and an electrode M(h).

The electrode C(g) is electrically connected to the control line CL(g).

The electrode M(h) is electrically connected to the sensing signal line ML(h) and is positioned such that an electric field part of which is blocked by an object approaching a region overlapping with the display panel is generated between the electrode M(h) and the electrode C(g).

Thus, the object approaching the region overlapping with the display panel can be sensed while image data is displayed on the display panel.

The input portion described in this embodiment includes the substrate 2803 and the bonding layer 2812 (see FIG. 15A and FIG. 16A).

The substrate 2803 is provided so that the sensing element 2150(g,h) is sandwiched between the substrate 2803 and the substrate 2802.

The bonding layer 2812 is provided between the substrate 2802 and the sensing element 2150(g,h) and has a function of bonding the substrate 2802 and the sensing element 2150(g,h) together.

The functional film 2802P is provided so that the sensing element 2150(g,h) is sandwiched between the functional film 2802P and the first display element 2110(i,j). Thus, the intensity of light reflected by the sensing element 2150(g,h) can be reduced, for example.

The input portion described in this embodiment includes one group of sensing elements 2150(g,1) to 2150(g,q) and another group of sensing elements 2150(1,h) to 2150(p,h) (see FIG. 18). Note that g is an integer of 1 to p, his an integer of 1 to q, and each of p and q is an integer greater than or equal to 1.

The group of the sensing elements 2150(g,1) to 2150(g,q) includes the sensing element 2150(g,h) and is provided in the row direction (indicated by an arrow Ro2 in the drawing).

The another group of sensing elements 2150(1,h) to 2150(p,h) includes the sensing element 2150(g,h) and is provided in the column direction (the direction indicated by an arrow Co2 in the drawing) that intersects the row direction.

The group of sensing elements 2150(g,1) to 2150(g,q) provided in the row direction includes the electrode C(g) that is electrically connected to the control line CL(g).

The another group of sensing elements 2150(1,h) to 2150(p,h) provided in the column direction includes the electrode M(h) that is electrically connected to the sensing signal line ML(h).

The control line CL(g) of the touch panel described in this embodiment includes a conductive film BR(g, h) (see FIG. 15A). The conductive film BR(g, h) includes a region overlapping with the sensing signal line ML(h).

The insulating film 2508 includes a region between the sensing signal line ML(h) and the conductive film BR(g,h). Thus, a short circuit between the sensing signal line ML(h) and the conductive film BR(g,h) can be prevented.

The touch panel described in this embodiment includes an oscillator circuit OSC and a detection circuit DC (see FIG. 18).

The oscillator circuit OSC is electrically connected to the control line CL(g) and has a function of supplying a control signal. For example, a rectangular wave, a sawtooth wave, or a triangular wave can be used as the control signal.

The detection circuit DC is electrically connected to the sensing signal line ML(h) and has a function of supplying a sensing signal on the basis of a change in potential of the sensing signal line ML(h).

Individual components included in the touch panel will be described below. Note that these components cannot be clearly distinguished in some cases, and one component may also serve as another component or include part of another component.

For example, the first conductive film can be used as the first electrode 2111(i,j). Moreover, the first conductive film can be used as the reflective film.

The second conductive film can be used as the conductive film 2522B serving as a source electrode or a drain electrode of a transistor.

The terminal 2901 can be electrically connected to a flexible printed circuit FPC2 using a conductive material ACF2. In addition, the terminal 2901 is electrically connected to the sensing element 2150(g,h).

<<Configuration Example of Pixel Circuit>>

A configuration example of a pixel circuit will be described with reference to FIG. 19. The pixel circuit 2200(i,j) is electrically connected to the signal line Sig1(j), the signal line sig2(j), the scan line G1(i), the scan line G2(i), the wiring CSCOM, and the third conductive film ANO. Similarly, a pixel circuit 2200(i,j+1) is electrically connected to a signal line Sig1(j+1), a signal line Sig2(j+1), the scan line G1(i), a scan line G2(i), the wiring CSCOM, and the third conductive film ANO.

The pixel circuit 2200(i,j) and the pixel circuit 2200(i,j+1) each include the switch SWT1 and a capacitor C11.

The pixel circuit 2200(i,j) and the pixel circuit 2200(i,j+1) each include a switch SWT2, a transistor M, and a capacitor C12.

For example, a transistor including a gate electrode electrically connected to the scan line G1(i) and a first electrode electrically connected to the signal line Sig1(j) can be used as the switch SWT1.

The capacitor C11 includes a first electrode electrically connected to a second electrode of the transistor used as the switch SWT1 and a second electrode electrically connected to the wiring CSCOM.

For example, a transistor including a gate electrode electrically connected to the scan line G2(i) and a first electrode electrically connected to the signal line Sig2(j) can be used as the switch SWT2.

The transistor M includes a gate electrode electrically connected to a second electrode of the transistor used as the switch SWT2 and a first electrode electrically connected to the third conductive film ANO.

Note that a transistor including a conductive film provided such that a semiconductor film is sandwiched between a gate electrode and the conductive film can be used as the transistor M. For example, the conductive film can be a conductive film electrically connected to a wiring that can supply the same potential as that of the gate electrode of the transistor M.

The capacitor C12 includes a first electrode electrically connected to the second electrode of the transistor used as the switch SWT2 and a second electrode electrically connected to the first electrode of the transistor M.

Note that in the pixel circuit 2200(i,j), the first electrode and the second electrode of the first display element 2110(i,j) are electrically connected to the second electrode of the transistor used as the switch SWT1 and the wiring VCOM1, respectively. This enables the first display element 2110 to be driven. Similarly, in the pixel circuit 2200(i,j+1), a first electrode and a second electrode of the first display element 2110(i,j+1) are electrically connected to the second electrode of the transistor used as the switch SWT1 and the wiring VCOM1, respectively. This enables the first display element 2110 to be driven.

Furthermore, in the pixel circuit 2200(i,j), the first electrode and the second electrode of the second display element 2120(i,j) are electrically connected to the second electrode of the transistor M and the fourth conductive film VCOM2, respectively. This enables the second display element 2120(i,j) to be driven. Similarly, in the pixel circuit 2200(i,j+1), the first electrode and the second electrode of a second display element 2120(i,j+1) are electrically connected to the second electrode of the transistor M and the fourth conductive film VCOM2, respectively. This enables the second display element 2120(i,j+1) to be driven.

<<Structure Example of Transistor>>

A bottom-gate transistor, a top-gate transistor, or the like can be used as the switch SWT1, the transistor M, and the transistor MD.

For example, a transistor including a semiconductor containing an element belonging to Group 14 can be used. Specifically, a semiconductor containing silicon can be used for a semiconductor film. For example, a transistor using single crystal silicon, polysilicon, microcrystalline silicon, amorphous silicon, or the like for a semiconductor film can be used.

As another example, a transistor using an oxide semiconductor for a semiconductor film can be used. Specifically, an oxide semiconductor containing indium or an oxide semiconductor containing indium, zinc, and an element M (aluminum, gallium, yttrium, or tin) can be used for a semiconductor film.

For example, a transistor whose leakage current in an off state is lower than that of a transistor using amorphous silicon for a semiconductor film can be used as the switch SWT1, the transistor M, the transistor MD, or the like. Specifically, a transistor containing an oxide semiconductor in a semiconductor film 2560 can be used as the switch SWT1, the transistor M, the transistor MD, or the like.

Thus, the pixel circuit can hold an image signal for a longer time than a pixel circuit including a transistor that uses amorphous silicon for a semiconductor film. Specifically, a selection signal can be supplied at a frequency of lower than 30 Hz, preferably lower than 1 Hz, further preferably less than once per minute while flickers are suppressed. Consequently, eyestrain on a user of the information terminal can be reduced, and power consumption for driving can be reduced.

The transistor that can be used as the switch SWT1 includes the semiconductor film 2560 and a conductive film 2523 including a region overlapping with the semiconductor film 2560 (see FIG. 16B). The transistor that can be used as the switch SWT1 also includes the conductive film 2522A and the conductive film 2522B that are electrically connected to the semiconductor film 2560.

Note that the conductive film 2523 and an insulating film 2505 serve as a gate electrode and a gate insulating film, respectively. The conductive film 2522A serves as one of a source electrode and a drain electrode, and the conductive film 2522B serves as the other of the source electrode and the drain electrode.

A transistor in which the semiconductor film 2560 is provided between the conductive film 2523 and a conductive film 2521 can be used as the transistor M (see FIG. 15B).

The use of above input/output device for the tablet information terminal 5200 in FIG. 12 described in Embodiment 4 achieves an electronic device that is highly visible, convenient, or reliable.

<Application Example of Display Module>

Next, an application example of a display module using the display panel in FIG. 13A will be described with reference to FIG. 20.

Figure 20:
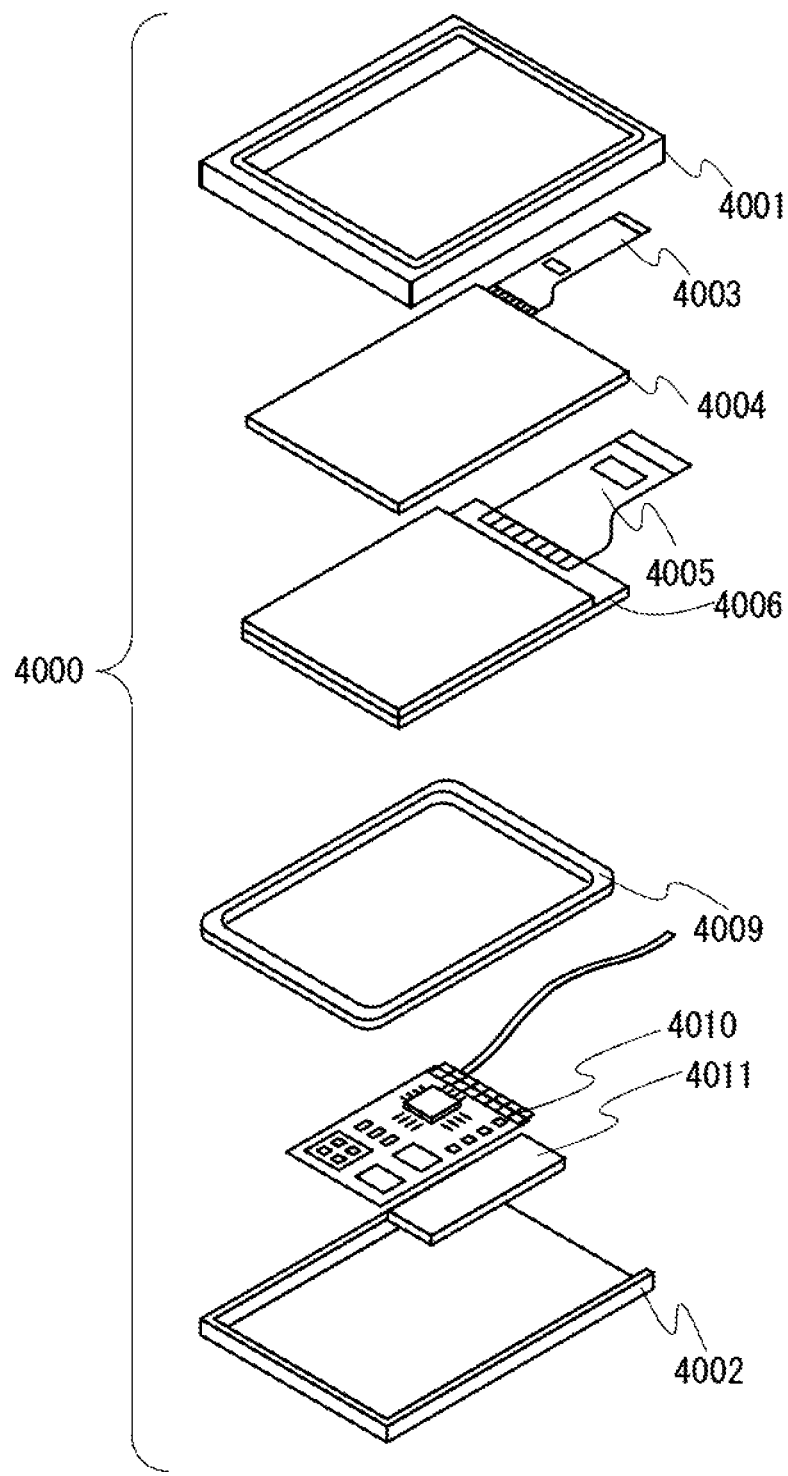
FIG. 20 is a perspective view illustrating a display module.

In a display module 4000 illustrated in FIG. 20, a touch panel 4004 connected to an FPC 4003, a display panel 4006 connected to an FPC 4005, a frame 4009, a printed board 4010, and a battery 4011 are provided between an upper cover 4001 and a lower cover 4002. Note that the battery 4011, the touch panel 4004, and the like are not provided in some cases.

The display panel illustrated in FIG. 13A can be used as the display panel 4006 in FIG. 20.

The shapes and/or sizes of the upper cover 4001 and the lower cover 4002 can be changed as appropriate in accordance with the sizes of the touch panel 4004 and the display panel 4006.

Like the touch panel 2000TP1 illustrated in FIG. 13A, the touch panel 4004 can be a resistive touch panel or a capacitive touch panel and can be used by overlapping the display panel 4006. Furthermore, a counter substrate (sealing substrate) of the display panel 4006 can have a touch panel function. Alternatively, a photosensor can be provided in each pixel of the display panel 4006 so that an optical touch panel is obtained. Further alternatively, an electrode for a touch sensor can be provided in each pixel of the display panel 4006 so that a capacitive touch panel is obtained. In such cases, the touch panel 4004 can be omitted.

The frame 4009 protects the display panel 4006 and functions as an electromagnetic shield for blocking electromagnetic waves generated by the operation of the printed board 4010. The frame 4009 may also function as a radiator plate.

The printed board 4010 is provided with a power supply circuit and a signal processing circuit for outputting a video signal and a clock signal. As a power source for supplying power to the power supply circuit, an external commercial power source or the battery 4011 provided separately may be used. The battery 4011 can be omitted in the case of using a commercial power source.

The display module 4000 may be additionally provided with a polarizing plate, a retardation plate, a prism sheet, or the like.

Note that this embodiment can be combined with any of the other embodiments in this specification as appropriate.

Embodiment 6

<Composition of CAC—OS>

Described below is the composition of a cloud-aligned composite oxide semiconductor (CAC—OS) applicable to a transistor of one embodiment of the present invention.

The CAC—OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC—OS, an In—Ga—Zn oxide with the CAC composition (such an In—Ga—Zn oxide may be particularly referred to as CAC—IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC—OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$, where m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC—OS relates to the material composition of an oxide semiconductor. In a material composition of a CAC—OS including In, Ga, Zn, and O, nanoparticle regions including Ga as a main component are observed in part of the CAC—OS and nanoparticle regions including In as a main component are observed in part thereof. These nanoparticle regions are randomly dispersed to form a mosaic pattern. Therefore, the crystal structure is a secondary element for the CAC—OS.

Note that in the CAC—OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC—OS, nanoparticle regions including the selected metal element(s) as a main component(s) are observed in part of the CAC—OS and nanoparticle regions including In as a main component are observed in part thereof, and these nanoparticle regions are randomly dispersed to form a mosaic pattern in the CAC—OS.

The CAC—OS can be formed by a sputtering method under conditions where a substrate is not heated, for example. In the case of forming the CAC—OS by a sputtering method, one or more selected from an inert gas (typically, argon), an oxygen gas, and a nitrogen gas can be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC—OS is characterized in that no clear peak is observed in measurement using $\theta/2\theta$ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC—OS obtained by irradiation with an electron beam having a probe diameter of 1 nm (also referred to as nanometer-sized electron beam), a ring-like region with high luminance and a plurality of bright spots in the ring-like region are observed. Therefore, the electron diffraction pattern indicates that the crystal structure of the CAC—OS includes a nanocrystal (nc) structure with no alignment in the plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC—OS has a structure different from that of an IGZO compound in which metal elements are evenly distributed, and has characteristics different from those of the IGZO compound. That is, in the CAC—OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC—OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including the CAC—OS has high reliability; thus, the CAC—OS is suitably used in a variety of semiconductor devices typified by a display.

At least part of this embodiment can be implemented in combination with any of the other embodiments described in this specification as appropriate.

(Notes on the Description in this Specification and the Like)

The following are notes on the structures in the above embodiments.

<Notes on One Embodiment of the Present Invention Described in Embodiments>

One embodiment of the present invention can be constituted by appropriately combining the structure described in an embodiment with any of the structures described in the other embodiments. In the case where a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text disclosed in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

<Notes on Ordinal Numbers>

In this specification and the like, ordinal numbers such as "first," "second," and "third" are used in order to avoid confusion among components. Thus, the terms do not limit the number or order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

<Notes on the Description for Drawings>

The embodiments are described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, terms for explaining arrangement, such as "over" and "under," are used for convenience to indicate a positional relation between components with reference to drawings. The positional relation between components is changed as appropriate in accordance with a direction in which the components are described. Therefore, the terms for explaining arrangement are not limited to those used in the specification and can be changed to other terms as appropriate depending on the situation.

The term "over" or "under" does not necessarily mean that a component is placed directly on or directly under and directly in contact with another component. For example, the expression "electrode B over insulating layer A" does not necessarily mean that the electrode B is on and in direct contact with the insulating layer A and can also mean the case where another component is provided between the insulating layer A and the electrode B.

In a block diagram in this specification and the like, components are functionally classified and shown by blocks that are independent of each other. However, in an actual circuit and the like, such components are sometimes hard to classify functionally, and there is a case where one circuit is associated with a plurality of functions or a case where a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed at the same time are sometimes denoted by the same reference numerals, and the description thereof is not repeated in some cases.

<Notes on Expressions that can be Rephrased>

In this specification and the like, the terms "one of a source and a drain" (or first electrode or first terminal) and "the other of the source and the drain" (or second electrode or second terminal) are used to describe the connection relation of a transistor. This is because the source and the drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

In this specification and the like, in the case where a transistor has two or more gates (such a structure is sometimes referred to as a dual-gate structure), these gates are referred to as a first gate and a second gate or as a front gate and a back gate in some cases. In particular, the term "front gate" can be replaced with a simple term "gate." The term "back gate" can be replaced with a simple term "gate." Note that a "bottom gate" is a terminal that is formed before a channel formation region in manufacture of a transistor, and a "top gate" is a terminal that is formed after a channel formation region in manufacture of a transistor.

A transistor is an element having three terminals: a gate, a source, and a drain. A gate is a terminal that functions as a control terminal for controlling the conduction (on/off) state of a transistor. Depending on the type of a transistor or levels of potentials supplied to two input/output terminals, one of the terminals functions as a source and the other functions as a drain. Therefore, the terms "source" and "drain" can be switched in this specification and the like.

In this specification and the like, the term "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." A ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, in some cases, the term "conductive film" can be used instead of "conductive layer," and the term "insulating film" can be used instead of "insulating layer." Moreover, such terms can be replaced with a word not including the term "film" or "layer" depending on the case or circumstances. For example, in some cases, the term "conductor" can be used instead of "conductive layer" or "conductive film," and the term "insulator" can be used instead of "insulating layer" or "insulating film."

In this specification and the like, the terms "wiring," "signal line," "power supply line," and the like can be replaced with each other depending on the case or circumstances. For example, in some cases, the term "signal line" or "power supply line" can be used instead of "wiring," and vice versa. In some cases, the term "signal line" can be used instead of "power supply line," and vice versa. As another example, the term "signal" can be used instead of "potential" that is supplied to a wiring and vice versa, depending on the case or circumstances.

<Notes on Definitions of Terms>

The following are definitions of the terms mentioned in the above embodiments.

<<Semiconductor>>

In this specification, a "semiconductor" may have characteristics of an "insulator" in some cases when the conductivity is sufficiently low, for example. Furthermore, a "semiconductor" and an "insulator" cannot be strictly distinguished from each other in some cases because the dividing line between the "semiconductor" and the "insulator" is not clear. Accordingly, in some cases, a "semiconductor" in this specification can be called an "insulator," and vice versa.

Furthermore, a "semiconductor" may have characteristics of a "conductor" in some cases when the conductivity is sufficiently high, for example. A "semiconductor" and a "conductor" cannot be strictly distinguished from each other in some cases because the dividing line between the "semiconductor" and the "conductor" is not clear. Accordingly, in some cases, a "semiconductor" in this specification can be called a "conductor," and vice versa.

Note that impurities in a semiconductor refer to, for example, elements other than the main components of a semiconductor layer. For example, an element with a concentration of lower than 0.1 atomic % is an impurity. If impurities are contained in a semiconductor, the density of states (DOS) may be formed in the semiconductor, the carrier mobility may be decreased, or the crystallinity may be decreased, for example. When the semiconductor is an oxide semiconductor, examples of impurities that change characteristics of the semiconductor include Group 1 elements, Group 2 elements, Group 13 elements, Group 14 elements, Group 15 elements, and transition metals other than the main components of the semiconductor; specific examples are hydrogen (included also in water), lithium, sodium, silicon, boron, phosphorus, carbon, and nitrogen. When the semiconductor is an oxide semiconductor, oxygen vacancies may be formed by entry of impurities such as hydrogen, for example. When the semiconductor is silicon, examples of impurities that change the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the drain and the source through the channel formation region.

Furthermore, functions of a source and a drain may be switched when a transistor of opposite polarity is employed or a direction of current flow is changed in circuit operation, for example. Therefore, the terms "source" and "drain" can be switched in this specification and the like.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source electrode and a drain electrode of the transistor are regarded as being electrically short-circuited. The "off state" of the transistor refers to a state in which the source electrode and the drain electrode of the transistor are regarded as being electrically disconnected. In the case where a transistor operates just as a switch, there is no particular limitation on the polarity (conductivity type) of the transistor.

An example of a mechanical switch is a switch formed using a microelectromechanical systems (MEMS) technology, such as a digital micromirror device (DMD). Such a switch includes an electrode that can be moved mechanically, and its conduction and non-conduction is controlled with movement of the electrode.

<<Connection>>

In this specification and the like, a description "X and Y are connected" means that X and Y are electrically connected, X and Y are functionally connected, and X and Y are directly connected. Accordingly, without being limited to a predetermined connection relation (e.g., a connection relation shown in drawings or texts), another connection relation is regarded as being included in the drawings or the texts.

Here, X and Y used here each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are regarded as being functionally connected when a signal output from X is transmitted to Y.

Note that an explicit description "X and Y are electrically connected" means that X and Y are electrically connected (i.e., X and Y are connected with another element or circuit provided therebetween), X and Y are functionally connected (i.e., X and Y are functionally connected with another element or circuit provided therebetween), and X and Y are directly connected (i.e., X and Y are connected without another element or circuit provided therebetween). That is, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X, Y, Z1, and Z2 each denote an object (e.g., a device, an element, a circuit, a wiring, an electrode, a terminal, a conductive film, or a layer).

Even when a circuit diagram shows that independent components are electrically connected to each other, one component has functions of a plurality of components in some cases. For example, when part of a wiring also functions as an electrode, one conductive film functions as the wiring and the electrode. Thus, "electrical connection" in this specification also means such a case where one conductive film has functions of a plurality of components.

<<Parallel and Perpendicular>>

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

<<Trigonal and Rhombohedral Crystal Systems>>

In this specification, trigonal and rhombohedral crystal systems are included in a hexagonal crystal system.

This application is based on Japanese Patent Application Serial No. 2016-116104 filed with Japan Patent Office on Jun. 10, 2016, the entire contents of which are hereby incorporated by reference.

What is claimed is:

1. A semiconductor device comprising:
   a first circuit comprising a first terminal, a second terminal, a first output terminal, and a resistor string;
   a second circuit comprising a third terminal, a fourth terminal, a second output terminal, and a resistor string;
   a pass transistor logic circuit comprising a first input terminal, a second input terminal, a third input terminal, and a third output terminal;
   a first switch;
   a second switch; and
   a selector comprising a fourth input terminal, a fourth output terminal, and a fifth output terminal,
   wherein:
   the third terminal of the second circuit is electrically connected to one terminal of the first switch,
   the second terminal of the first circuit is electrically connected to the other terminal of the first switch,
   one terminal of the second switch is electrically connected to the fourth terminal of the second circuit,
   the other terminal of the second switch is electrically connected to the second terminal of the first circuit,
   the first output terminal of the first circuit is electrically connected to the first input terminal of the pass transistor logic circuit,
   the second output terminal of the second circuit is electrically connected to the second input terminal of the pass transistor logic circuit,
   the third output terminal of the pass transistor logic circuit is electrically connected to the fourth input terminal of the selector, and
   when digital data is input to the third input terminal of the pass transistor logic circuit, the digital data is converted into analog data, and the analog data is output from one of the fourth output terminal and the fifth output terminal of the selector.

2. The semiconductor device according to claim 1, further comprising a third circuit between an electrical connection between the third output terminal of the pass transistor logic circuit and the fourth input terminal of the selector, the third circuit comprising a fifth input terminal and a sixth output terminal,
   wherein:
   the fifth input terminal of the third circuit is electrically connected to the third output terminal of the pass transistor logic circuit,
   the sixth output terminal of the third circuit is electrically connected to the fourth input terminal of the selector, and
   the third circuit is configured to amplify a potential input to the fifth input terminal of the third circuit and output the amplified potential to the sixth output terminal of the third circuit.

3. The semiconductor device according to claim 2,
   wherein the third circuit further comprises a fifth terminal, and wherein the third circuit is configured to stop operating in accordance with a potential input to the fifth terminal of the third circuit.

4. The semiconductor device according to claim 1, further comprising a third switch between an electrical connection between the third output terminal of the pass transistor logic circuit and the fourth input terminal of the selector,
 wherein one terminal of the third switch is electrically connected to the third output terminal of the pass transistor logic circuit, and
 wherein the other terminal of the third switch is electrically connected to the fourth input terminal of the selector.

5. The semiconductor device according to claim 4,
 wherein the third switch comprises a first transistor, and
 wherein a channel formation region of the first transistor comprises an oxide containing at least one of indium, an element M, and zinc, where the element M is one of aluminum, gallium, yttrium, and tin.

6. The semiconductor device according to claim 1, further comprising a third switch and a third circuit between an electrical connection between the third output terminal of the pass transistor logic circuit and the fourth input terminal of the selector, the third circuit comprising a fifth input terminal and a sixth output terminal,
 wherein:
  the fifth input terminal of the third circuit is electrically connected to the third output terminal of the pass transistor logic circuit,
  the sixth output terminal of the third circuit is electrically connected to one terminal of the third switch,
  the other terminal of the third switch is electrically connected to the fourth input terminal of the selector, and
  the third circuit is configured to amplify a potential input to the fifth input terminal of the third circuit and output the amplified potential to the sixth output terminal of the third circuit.

7. The semiconductor device according to claim 6,
 wherein the third switch further comprises a first transistor, and
 wherein a channel formation region of the first transistor comprises an oxide containing at least one of indium, an element M, and zinc, where the element M is one of aluminum, gallium, yttrium, and tin.

8. The semiconductor device according to claim 2,
 wherein:
  the third circuit further comprises an operational amplifier,
  the fifth input terminal of the third circuit is electrically connected to a non-inverting input terminal of the operational amplifier,
  the sixth output terminal of the third circuit is electrically connected to an output terminal of the operational amplifier, and
  the output terminal of the operational amplifier is electrically connected to an inverting input terminal of the operational amplifier.

9. The semiconductor device according to claim 1,
 wherein:
  the first circuit further comprises a first resistor and a second resistor,
  the second circuit further comprises a third resistor and a fourth resistor,
  the first output terminal of the first circuit comprises a fifth terminal and a sixth terminal,
  the second output terminal of the second circuit comprises a seventh terminal and an eighth terminal,
  the first terminal of the first circuit is electrically connected to one terminal of the first resistor,
  the other terminal of the first resistor is electrically connected to one terminal of the second resistor,
  the other terminal of the second resistor is electrically connected to the second terminal of the first circuit,
  the fifth terminal is electrically connected to the one terminal of the first resistor,
  the sixth terminal is electrically connected to the one terminal of the second resistor,
  the third terminal of the second circuit is electrically connected to one terminal of the third resistor,
  the other terminal of the third resistor is electrically connected to one terminal of the fourth resistor,
  the other terminal of the fourth resistor is electrically connected to the fourth terminal of the second circuit,
  the seventh terminal is electrically connected to the one terminal of the third resistor, and
  the eighth terminal is electrically connected to the one terminal of the fourth resistor.

10. The semiconductor device according to claim 1,
 wherein the first switch and the second switch each comprise a second transistor, and
 wherein a channel formation region of the second transistor comprises an oxide containing at least one of indium, an element M, and zinc, where the element M is one of aluminum, gallium, yttrium, and tin.

11. The semiconductor device according to claim 1, further comprises a fourth switch and a fifth switch,
 wherein one terminal of the fourth switch is electrically connected to the fourth terminal, and
 wherein one terminal of the fifth switch is electrically connected to the fourth terminal.

12. A system comprising:
 the semiconductor device according to claim 1;
 an illuminometer;
 a fourth circuit;
 a fifth circuit;
 a first display panel; and
 a second display panel,
 wherein:
  the illuminometer is electrically connected to the fourth circuit,
  the fourth circuit is electrically connected to the fifth circuit,
  the fifth circuit is electrically connected to the semiconductor device,
  the first display panel is electrically connected to the semiconductor device,
  the second display panel is electrically connected to the semiconductor device,
  the fourth circuit is configured to generate first data for determining a grayscale of an image displayed on the first display panel and/or the second display panel, in accordance with an illuminance measured with the illuminometer, and
  the fifth circuit is configured to generate an input signal transmitted to the semiconductor device, in accordance with second data transmitted from outside and information on the grayscale.

13. A method for operating the system according to claim 12, comprising:
 a first step comprising a step of measuring the illuminance by the illuminometer;

a second step comprising a step of transmitting the illuminance from the illuminometer to the fourth circuit;

a third step comprising a step of generating the first data for determining the grayscale of the image displayed on the first display panel and the grayscale of the image displayed on the second display panel by the fourth circuit in accordance with the illuminance;

a fourth step comprising a step of transmitting the first data from the fourth circuit to the fifth circuit, and a step of transmitting the second data from the outside to the fifth circuit;

a fifth step comprising a step of initializing the semiconductor device;

a sixth step comprising a step in which third data to be transmitted to the first display panel is generated by the fifth circuit in accordance with the first data and the second data, a step of transmitting the third data from the fifth circuit to the semiconductor device, and a step of performing digital-to-analog conversion on the third data to obtain fourth data by the semiconductor device;

a seventh step comprising a step of transmitting the fourth data from the semiconductor device to the first display panel and displaying the image on the first display panel;

an eighth step comprising a step of initializing the semiconductor device;

a ninth step comprising a step in which fifth data to be transmitted to the second display panel is generated by the fifth circuit in accordance with the first data and the second data, a step of transmitting the fifth data from the fifth circuit to the semiconductor device, and a step of performing digital-to-analog conversion on the fifth data to obtain sixth data by the semiconductor device; and a tenth step comprising a step of transmitting the sixth data from the semiconductor device to the second display panel and displaying the image on the second display panel, wherein the second data is video data.

* * * * *